(12) United States Patent
Wan et al.

(10) Patent No.: US 10,999,684 B1
(45) Date of Patent: May 4, 2021

(54) MEMS MICROPHONE AND METHOD OF MANUFACTURING THE MEMS MICROPHONE

(71) Applicant: SAE Magnetics (H.K.) Ltd., Hong Kong (HK)

(72) Inventors: Lik Hang Ken Wan, Hong Kong (HK); Masashi Shiraishi, Hong Kong (HK); Akio Nakao, Hong Kong (HK)

(73) Assignee: SAE Magnetics (H.K.) Ltd., Hong Kong (HK)

( * ) Notice: Subject to any disclaimer, the term of this patent is extended or adjusted under 35 U.S.C. 154(b) by 0 days.

(21) Appl. No.: 16/745,429

(22) Filed: Jan. 17, 2020

(51) Int. Cl.
| | |
|---|---|
| H04R 19/00 | (2006.01) |
| H04R 19/04 | (2006.01) |
| B81B 7/00 | (2006.01) |
| B81C 1/00 | (2006.01) |
| H04R 17/02 | (2006.01) |
| H04R 1/04 | (2006.01) |
| H04R 31/00 | (2006.01) |
| H04R 7/04 | (2006.01) |

(52) U.S. Cl.
CPC .......... *H04R 19/04* (2013.01); *B81B 7/0077* (2013.01); *B81C 1/00333* (2013.01); *H04R 1/04* (2013.01); *H04R 7/04* (2013.01); *H04R 17/02* (2013.01); *H04R 19/005* (2013.01); *H04R 31/003* (2013.01); *H04R 31/006* (2013.01); *B81B 2201/0257* (2013.01); *B81B 2207/012* (2013.01); *B81C 2203/0172* (2013.01); *H04R 2201/003* (2013.01)

(58) Field of Classification Search
CPC ...... H04R 19/04; H04R 19/005; H04R 17/02; H04R 1/04; H04R 31/003; H04R 31/006; H04R 7/04; H04R 2201/003; B81B 7/0077; B81B 2201/0257; B81B 2207/012; B81C 1/00333; B81C 2203/0172

See application file for complete search history.

(56) References Cited

U.S. PATENT DOCUMENTS

| | | | |
|---|---|---|---|
| 4,654,554 A | 3/1987 | Kishi | |
| 6,347,147 B1* | 2/2002 | Downs, Jr. | ............. H04R 17/02 381/114 |
| 6,946,695 B2 | 9/2005 | Schiller | |
| 7,998,091 B2* | 8/2011 | Carim | ................ G01N 29/2437 600/586 |
| 10,209,157 B2* | 2/2019 | Coronato | ........... G01C 19/5726 |
| 2006/0291677 A1* | 12/2006 | Chou | ..................... H04R 17/02 381/190 |
| 2017/0350916 A1 | 12/2017 | Dubbeldeman et al. | |
| 2018/0058915 A1 | 3/2018 | Mögelin et al. | |

(Continued)

FOREIGN PATENT DOCUMENTS

| | | |
|---|---|---|
| JP | 4333883 B2 | 9/2009 |
| JP | 2009278859 A | 11/2009 |
| JP | 5988494 B2 | 9/2016 |

*Primary Examiner* — Matthew A Eason

(57) ABSTRACT

A MEMS microphone includes a MEMS transducer, a sealing cover, and a package substrate. The MEMS transducer includes an element substrate, a plurality of cantilevered beams, and a weight. An airtight sealing structure is formed with the sealing cover and the package substrate, which is formed by mounting the MEMS transducer on the package substrate, and adhering the sealing cover to the package substrate so as to surround the MEMS transducer.

15 Claims, 21 Drawing Sheets

(56) References Cited

U.S. PATENT DOCUMENTS

2018/0186622 A1* 7/2018 Mogelin ............... H04R 19/04
2018/0364274 A1   12/2018 Dubbeldeman et al.
2019/0162753 A1*  5/2019 Yang .................... G01P 15/125

* cited by examiner (a)

(b)

MEMS MICROPHONE AND METHOD OF MANUFACTURING THE MEMS MICROPHONE

BACKGROUND

Field of the Invention

The present invention relates to a MEMS microphone having a piezoelectric type transducer and method of manufacturing the MEMS microphone.

Related Background Art

Piezoelectric material has been widely used for functional electronic components such as an actuator for generating deformation by applying voltage or a sensor for generating voltage from the deformation of elements in a reverse way, etc. A thin-film piezoelectric material, processed into a thin-film like shape, is widely used for MEMS (Micro Electro Mechanical Systems).

A lead (Pb)-based dielectric material having large piezoelectric characteristics, especially, Lead Zirconate Titanate, formula, Pb $(Zr_xTi_{(1-x)})$ $O_3$-based perovskite-type ferroelectric called as "PZT", has been widely used.

On the other hand, the MEMS is a device which a minute movable element and an electronic circuit are integrated on a substrate (which is also called element substrate) made of silicon and so on. The MEMS is an element which transduces physical quantity to electric signal. Therefore, the MEMS is also called "MEMS transducer", in the present invention. The MEMS transducer is used as a microphone, sensor, actuator and so on.

By the way, as the MEMS transducer which is used as the microphone, the sensor such as the acceleration sensor, the vibration sensor, the angular velocity sensor or the like, a piezoelectric type MEMS transducer, which has a piezoelectric material film made of piezoelectric material, and a membrane type MEMS transducer, which has a membrane, are conventionally known.

Concerning the piezoelectric type MEMS transducer, for example, the sensor, for angular velocity, incline, and so on, is disclosed in JP 5988494 (also called patent document 1), JP 4333883 (also called patent document 2). The sensor has the piezoelectric material film, a weight adhered to the surface of the piezoelectric material film and electrodes. Further, concerning the device having the MEMS transducer, a generating unit is disclosed in JP 2009-278859 (also called patent document 3). In the generating unit, the electrodes are formed on the both sides of the piezoelectric material film, and the weight is provided. Furthermore, an acoustic transducer, having the piezoelectric material film and the weight, is disclosed in U.S. Pat. No. 4,654,554 (also called patent document 4). A rotational rate sensor, having the piezoelectric material film and the weight, is disclosed in U.S. Pat. No. 6,946,695 (also called patent document 5).

Concerning the membrane type MEMS transducer, for example, the MEMS transducers, which is respectively disclosed in US2018/0058915 (also called patent document 6), US2018/0364274 (also called patent document 7), US2018/0186622 (also called patent document 8), US2017/0350916 (also called patent document 9), are known.

SUMMARY OF THE INVENTION

By the way, it is important that performance, namely, sensitivity is enhanced, in the MEMS transducer. For this, it is indispensable that a vibration is detected accurately by the piezoelectric material film or the membrane. On this point, it is preferable that the MEMS transducer has a structure which the vibration of the weight is likely to be transmitted to the piezoelectric material film or the membrane, for example, the structure which the weight is supported by the piezoelectric material film, or the like, as the above-described conventional piezoelectric type MEMS transducer.

In that case, especially, when the MEMS transducer is used as a microphone, it is preferable that both the membrane and the weight are accommodated in a casing, as the above-described conventional membrane type MEMS transducer, thereby the influence of outer noise is attenuated.

For example, it is preferable that both the weight 301 and the suspension 302 are accommodated in the housings 303, 306, as the MEMS transducer 300 having the weight 301, the suspension 302, the housings 303, 306, membrane 304 and the MEMS cartridge 305, illustrated in FIG. 20.

However, the MEMS transducer 300 has a two-room structure which an accommodation part for the weight 301 and an accommodation part for the membrane 304 are physically divided. Therefore, the MEMS transducer 300 has a structure which the vibration of the weight 301 is not detected directly by the membrane 304. Namely, in case of the MEMS transducer 300, air vibrates because of the vibration of the weight 301, the vibration of the air is transmitted to the membrane 304 via an opening 307, thereby the vibration is detected by the membrane 304. Therefore, in the MEMS transducer 300, the vibration is likely to be attenuated before being detected by the membrane 304, therefore it is difficult that the sensitivity is enhanced.

Moreover, in the MEMS transducer, which is used as a microphone (also referred to "MEMS microphone"), it is necessary that the sound hole, for taking in a sound from outside, is formed in the casing. For example, it is necessary that the sound hole 392b is formed, as the MEMS microphone 390 having the MEMS transducer 391, the cap 392, the ASIC 393 and the bottom part 394, illustrated in FIG. 21. Therefore, it is difficult that the influence of outer noise is attenuated. Further, particles are likely to enter inside.

Accordingly, it is extremely difficult that the influence of outer noise is attenuated and the sensitivity is enhanced without the particles entering, in the conventional MEMS microphone.

Hence the present invention is made to solve the above problem, and it is an object to provide the MEMS microphone having a structure, which the influence of outer noise is attenuated and the sensitivity is enhanced without the particles entering, and method of manufacturing the MEMS microphone.

To solve the above problem, the present invention is a MEMS microphone including: a MEMS transducer; a sealing cover; and a package substrate; the MEMS transducer includes an element substrate, a plurality of cantilevered beams, and a weight, the cantilevered beam respectively has a base part, fixed on the element substrate, and a free beam part, not fixed on the element substrate, and the cantilevered beams are formed by laminating a piezoelectric material film and a first, second electrode films being formed to sandwich the piezoelectric material film, the free beam part has a beam tip, and the free beam part is formed in a tapered shape which the width gradually decreases from the base part to the beam tip, the beam tips of all the plurality of cantilevered beams are converged toward a tip point, the weight is adhered to a convergent area including the beam tips of the cantilevered beams, the MEMS microphone further includes an airtight sealing structure, formed with the sealing cover and the package substrate, which is formed by mounting the MEMS transducer on the package substrate, and adhering the sealing cover to the package substrate so as to surround the MEMS transducer.

In case of the above-described MEMS microphone, it is preferable that the sealing cover and the package substrate form a sealed-up space, which is decompressed than the atmospheric pressure.

Further, in case of the above-described MEMS microphone, it is preferable that the package substrate has a package surface, formed flat, an ASIC is mounted on the package surface together with the MEMS transducer, the sealing cover and the package substrate form a sealed-up space, and the ASIC is accommodated in the sealed-up space together with the MEMS transducer.

Further, in case of the above-described MEMS microphone, it is possible that the package substrate is formed with a cavity substrate, which has a concave part formed on the surface, and has an annular convex part having a flat surface, the sealing cover is formed with a lid plate, which is adhered to the annular convex part, the airtight sealing structure is a structure which an ASIC is mounted on a bottom part of the concave part of the cavity substrate together with the MEMS transducer, and the lid plate is adhered to the annular convex part.

Further, in case of the above-described MEMS microphone, it is preferable that the weight is formed in an almost similar figure, which is smaller than a beam member including all the plurality of cantilevered beams.

Further, in case of the above-described MEMS microphone, it is possible that the weight is arranged in the position which a center part of the weight is overlapped to the tip point.

Further, in case of the above-described MEMS microphone, it is possible that the weight is adhered to an outer surface of the cantilevered beams.

Further, in case of the above-described MEMS microphone, it is preferable that the weight is adhered to all the beam tips, which are converged toward the tip point.

Further, in case of the above-described MEMS microphone, it is possible that the weight is formed with stainless steel.

Further, it is possible that the sealing cover is adhered to the package substrate with forming a weld to form the airtight sealing structure.

Then, the present invention provides a method of manufacturing a MEMS microphone having a MEMS transducer, a sealing cover and a package substrate, including: a MEMS transducer manufacturing step for manufacturing the MEMS transducer; a mounting step for mounting the MEMS transducer on the package substrate; and an airtight sealing step for forming an airtight sealing structure, which is surrounded by the sealing cover and the package substrate, by adhering the sealing cover to the package substrate so as to surround the MEMS transducer, the MEMS transducer manufacturing step includes a laminated film forming step for forming a laminated film, which a first electrode film, a piezoelectric material film and a second electrode film are laminated sequentially, on a surface of a MEMS substrate, used for manufacturing the MEMS transducer, a laminated film pattering step for patterning the laminated film, so that a surface of the piezoelectric material film is exposed and the first electrode film, the piezoelectric material film and the second electrode film are divided into a plurality of beam regions, in an respective element region, of the MEMS substrate, which the MEMS transducer is formed, a metal film forming step for forming a metal film on the surface of the MEMS substrate, a weight forming step for forming a weight on the exposed surface of the piezoelectric material film so that an unnecessary part of the metal film is removed to connect the beam regions are connected, in the respective element region, a dividing step for dividing the laminated film by removing the unnecessary part of the laminated film, into the respective element regions, and a cantilevered beams forming step for forming cantilevered beams, made of the remained parts of the first electrode film, the piezoelectric material film and the second electrode film, by removing an unnecessary part of a rear surface, of the MEMS substrate, which the laminated film is not formed.

In case of the above-described method of manufacturing the MEMS microphone, it is possible that the airtight sealing step has a decompression step which the sealing cover and the package substrate are arranged inside a vacuum chamber, and the inside of the vacuum chamber is decompressed.

In case of the above-described method of manufacturing the MEMS microphone, it is possible that the laminated film forming step is performed so that a SOI substrate is used as the MEMS substrate, the laminated film is formed on a silicon thin-film layer of the SOI substrate.

In case of the above-described method of manufacturing the MEMS microphone, it is preferable that the metal film forming step is performed so that the metal film is formed with stainless steel.

In case of the above-described method of manufacturing the MEMS microphone, it is possible that the laminated film pattering step is performed so that the beam regions are respectively formed in a tapered shape having a beam tip, and the beam tips are converged entirely toward a tip point, the weight forming step is performed so that a part, of the metal film, which is formed in a convergent area, including the beam tips of the beam regions, is left.

The present invention will be more fully understood from the detailed description given hereinbelow and the accompanying drawings which are given by way of illustration only, and thus are not to be considered as limiting the present invention.

DETAILED DESCRIPTION OF THE EMBODIMENTS

In the following, embodiments of the present invention will be described with reference to the drawings. Note that the same components will be referred to with the same numerals or letters, while omitting their overlapping descriptions.

(Structure of the MEMS Microphone)

Figure 2:
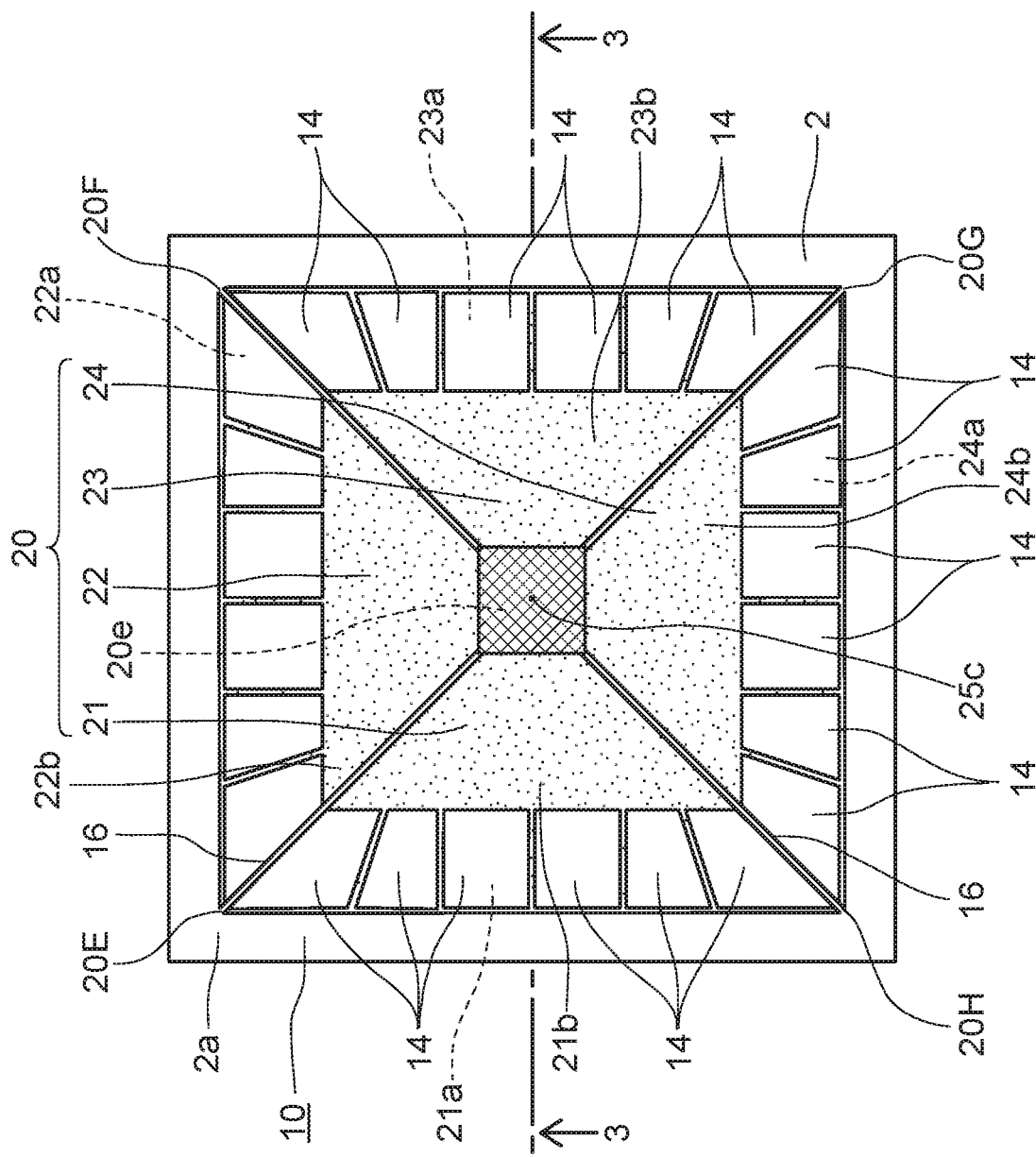
FIG. 2 is a plan view showing the MEMS transducer of the front surface side.
Figure 3:
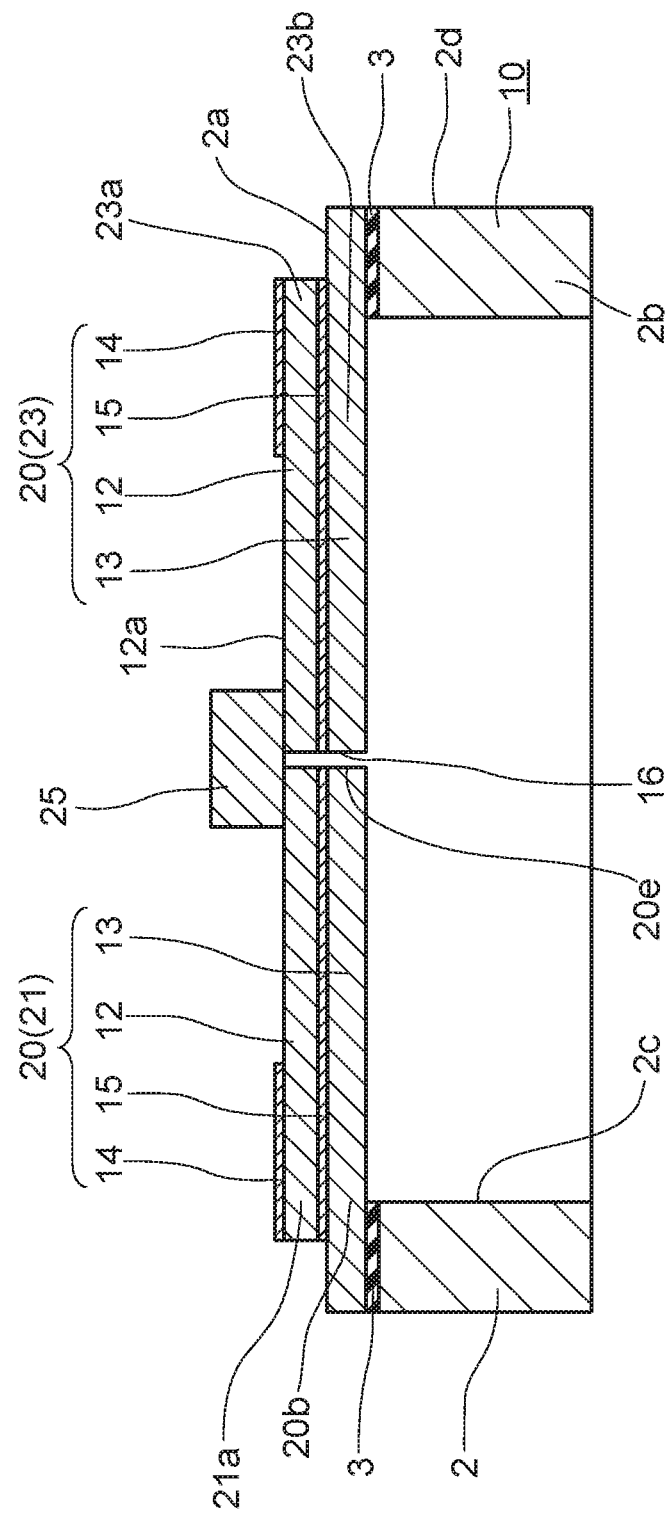
FIG. 3 is a sectional view taken along the line 3-3 in FIG. 2.
Figure 4:
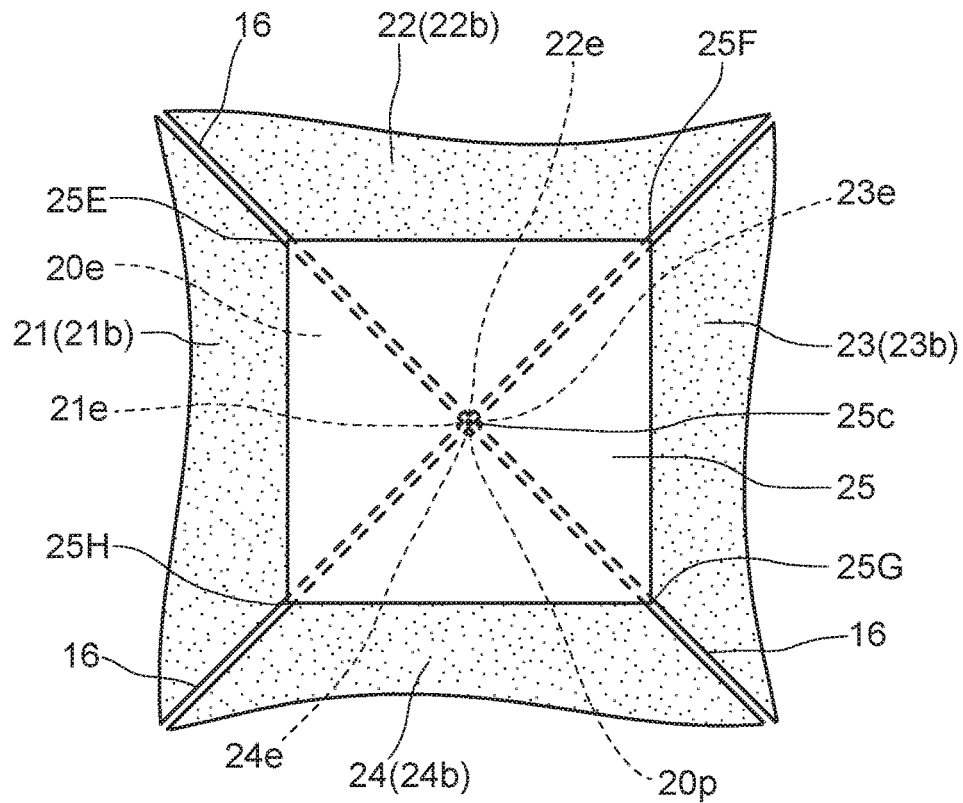
FIG. 4 (a) is a plan view showing the principal part of the MEMS transducer, with enlargement, when the weight is formed in the center in a plan view of a beam member, FIG. 4 (b) is a plan view showing the principal part of the MEMS transducer, with enlargement, when the weight is formed in a shifted position from the center in a plan view of the beam member.
Figure 4:
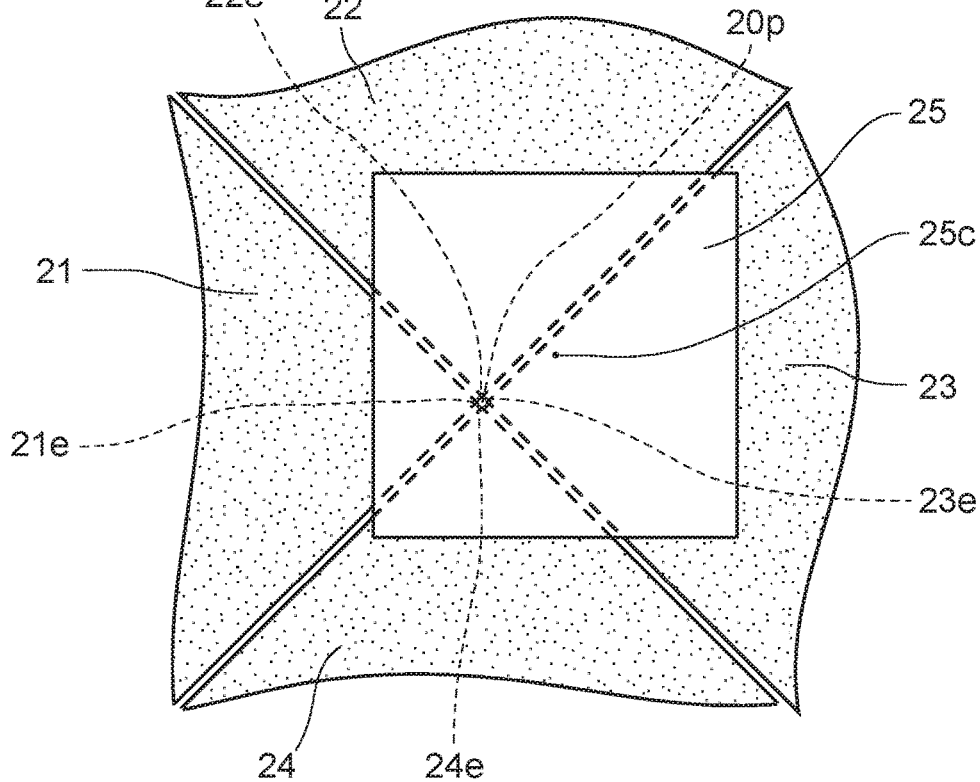
Figure 5:
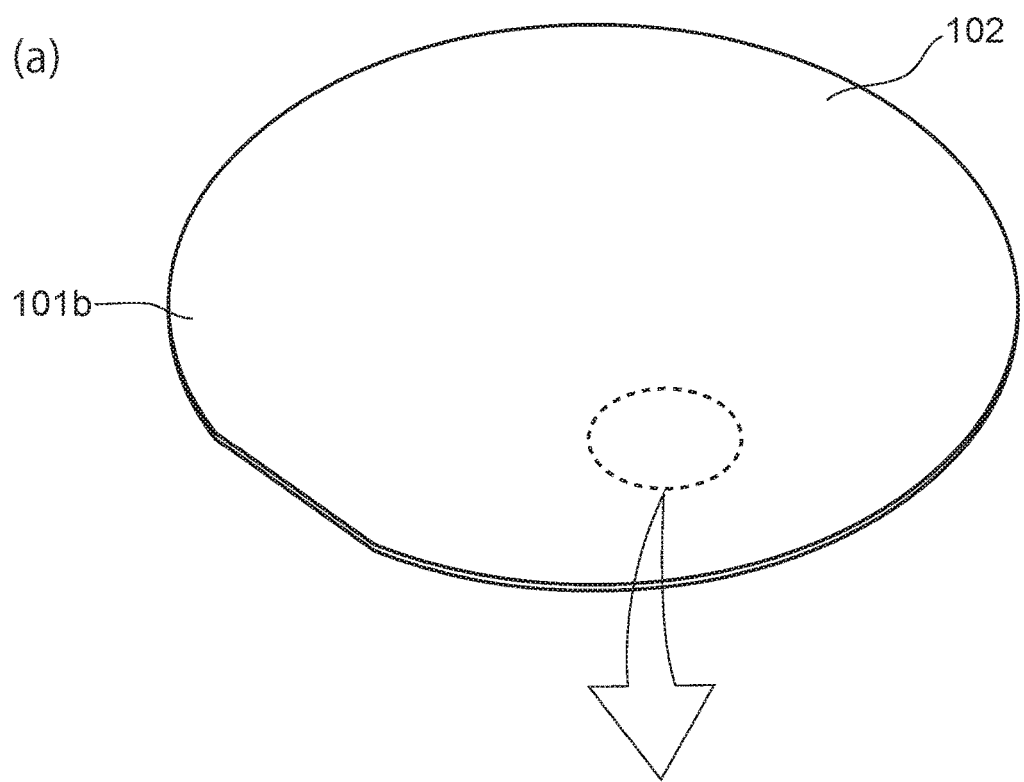
FIG. 5 (a) is a perspective view showing a SOI substrate, FIG. 5 (b) is a plan view, with enlargement, showing the front surface of the SOI substrate.
Figure 5:
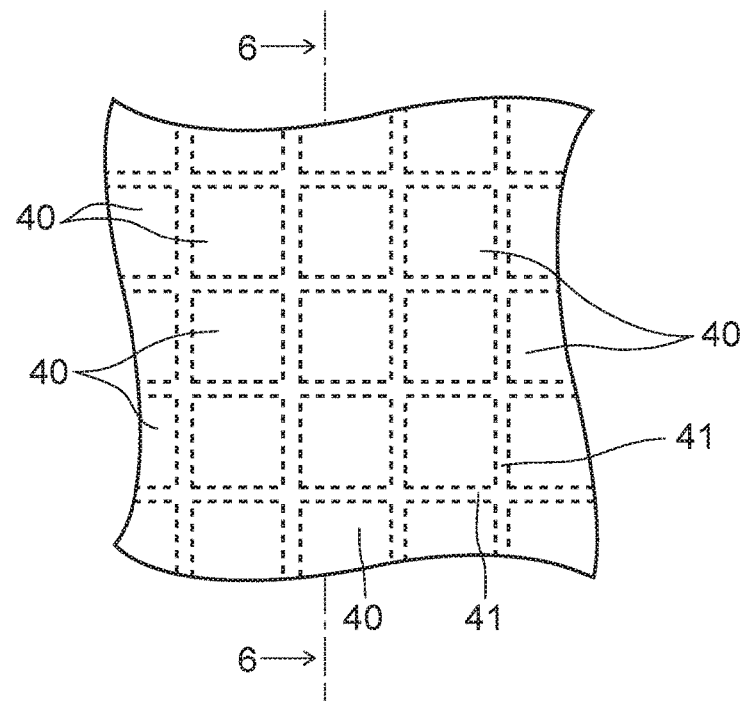

To begin with, the structure of a MEMS microphone 100 according to the embodiment of the present invention will be explained with reference to FIG. 1 to FIG. 4 (*a*), FIG. 4 (*b*). The MEMS microphone 100 is used as a bone conduction microphone.

Figure 1:
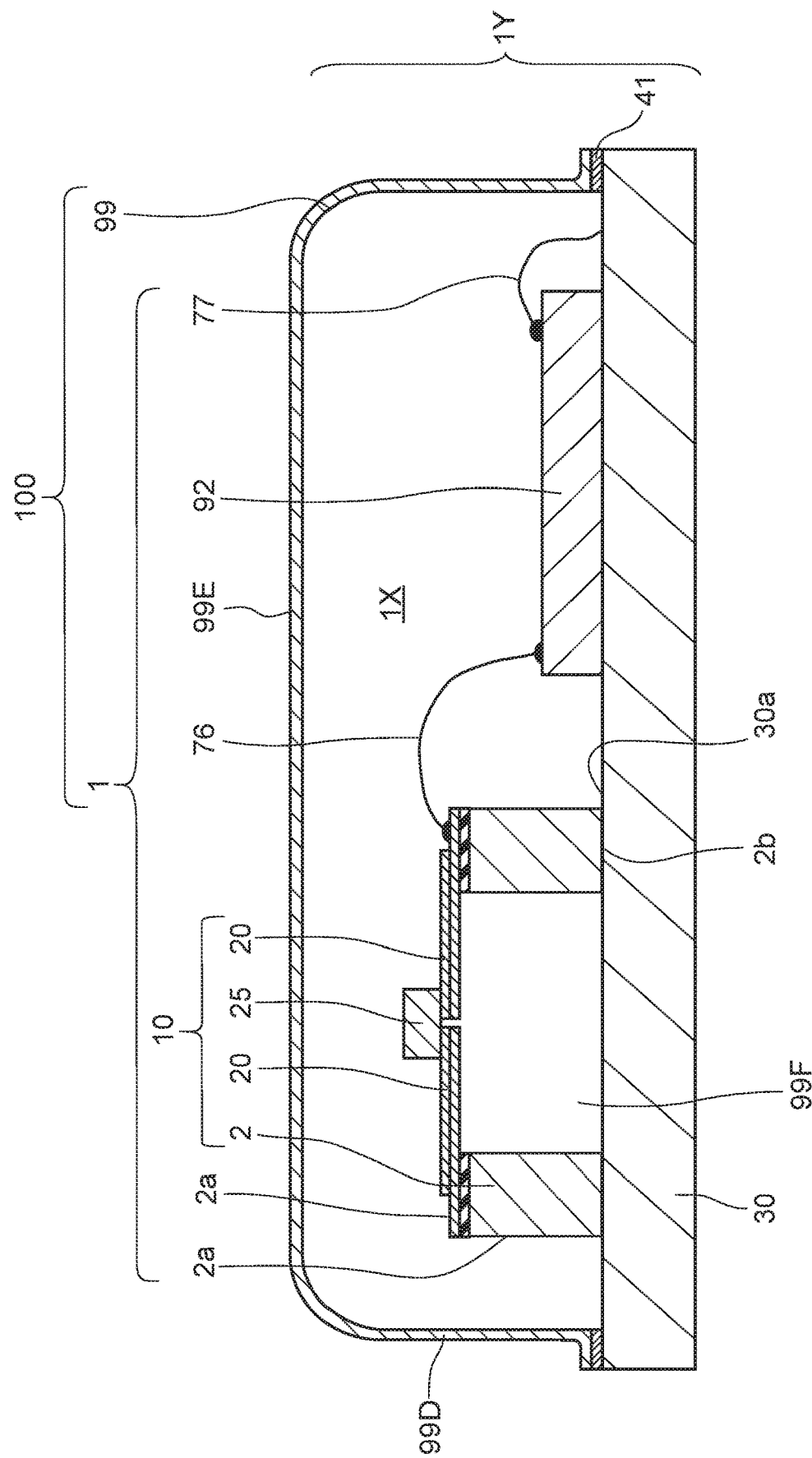
FIG. 1 is a sectional view showing a MEMS microphone having a MEMS transducer according to the embodiment of the present invention.

Here, FIG. 1 is a sectional view showing the MEMS microphone 100 having the MEMS transducer 10 according to the embodiment of the present invention. FIG. 2 is a plan view showing the MEMS transducer 10 of the front surface 2*a* side. FIG. 3 is a sectional view taken along the line 3-3 in FIG. 2. FIG. 4 (*a*) is a plan view showing the principal part of the MEMS transducer 10, with enlargement, when a weight 25 is adhered to the center in a plan view of a beam member 20, FIG. 4 (*b*) is a plan view showing the principal part of the MEMS transducer 10, with enlargement, when the weight 25 is adhered to a shifted position from the center in a plan view of the beam member 20.

As illustrated in FIG. 1, the MEMS microphone 100 has a MEMS package 1 and a sealing cover 99.

The MEMS package 1 has the MEMS transducer 10, a package substrate 30, which the MEMS transducer 10 is adhered to, and an ASIC 92. The MEMS transducer 10 and the ASIC 92 are mounted on the package substrate 30 by the WB (Wire Bonding), in the MEMS package 1.

The MEMS microphone 100 has an airtight sealing structure 1Y. The airtight sealing structure 1Y is a structure which the MEMS transducer 10 and the ASIC 92 are sealed with the sealing cover 99 and the package substrate 30 with keeping an airtightness. In the MEMS microphone 100, the MEMS transducer 10 and the ASIC 92 are mounted on the package substrate 30, the sealing cover 99 is adhered to the package substrate 30 by a forming of a weld 41 so that the MEMS transducer 10 and the ASIC 92 are surrounded by the sealing cover 99, thereby the airtight sealing structure 1Y is formed.

The MEMS microphone 100 has a sealed-up space 1X, which is surrounded by the sealing cover 99 and the package substrate 30, because of the airtight sealing structure 1Y. Then the MEMS transducer 10 and the ASIC 92 are accommodated in the sealed-up space 1X. As later-described in detail, the sealed-up space 1X is decompressed than the atmospheric pressure.

The MEMS transducer 10 is mounted on the package substrate 30 so that the front surface 2*a* side opposes to the sealing cover 99. Further, the MEMS transducer 10 is connected to the ASIC 92 with the wire 76. The ASIC 92 is connected to the package substrate 30 with the wire 77.

The MEMS transducer 10 has the element substrate 2 and the beam member 20 and the weight 25. Because the MEMS transducer 10 has the later-described piezoelectric material film 12, the MEMS microphone 100 is the piezoelectric type MEMS microphone.

The element substrate 2 is a substrate formed in a rectangular shape in a plan view (almost square), as illustrated in FIG. 2, and it is formed with silicon. As illustrated in FIG. 3, in the element substrate 2, an insulating film 3, made of silicon dioxide ($SiO_2$) is formed on the front surface 2*a* side. A later-described silicon thin-film 13 is formed on the insulating film 3, the beam member 20, having the silicon thin-film 13, and the weight 25 are formed on the front surface 2*a* side of the element substrate 2. Further, an element hole-part 2*c* is formed on the rear surface 2*b* side of the element substrate 2.

(Beam Member and Weight)

The beam member 20 has four cantilevered beams 21, 22, 23, 24, as illustrated in FIG. 2. The four cantilevered beams 21, 22, 23, 24 are arranged so as to form a rectangular shape in a plan view (almost square) as a whole.

Each of the cantilevered beams 21, 22, 23, 24, as illustrated in FIG. 3, has the piezoelectric material film 12, a first electrode film (referred to also as lower electrode film) 15 and a second electrode film (referred to also as upper electrode film) 14, which are formed to sandwich the piezoelectric material film 12, and the above-described silicon thin-film 13.

The piezoelectric material film 12 is formed to be a thin-film shape using a piezoelectric material made of lead zirconate titanate, shown by general formula Pb ($Zr_xTi_{(1-x)}$) $O_3$ (referred to also as "PZT" in the following). The piezoelectric material film 12 is an epitaxial film formed by epitaxial growth, and for example it has a thickness of about 1 μm-5 μm. Further, the piezoelectric material film 12 is a sputter film formed by sputtering.

A piezoelectric ceramics (much of them are ferroelectric substance) such as barium titanate, lead titanate or the like, non-lead system piezoelectric ceramics not including titanium or lead are able to be used for the piezoelectric material film 12, in place of PZT.

The silicon thin-film 13 is a member made of polycrystalline silicon. The silicon thin-film 13 supports the piezoelectric material film 12 and the weight 25. The silicon thin-film 13 has a function as a spring which supports the weight 25 and extends or shrinks in accordance with the vibration (vibration according to the three-dimensional direction) of the weight 25.

The first electrode film 15 is a thin-film (thickness about 100 nm) made of metal material which has Pt (it may include Au, Ag, Pd, Ir, Ru, Cu, in addition to Pt) as main ingredient, it is formed on the silicon thin-film 13. A crystal structure of the first electrode film 15 is a face-centered cubic structure.

The second electrode film 14 is a polycrystal thin-film (thickness about 50 nm) with metal material which has Pt (it may include Au, Ag, Pd, Ir, Rh, Ni, Pb, Ru, Cu, in addition to Pt) as main ingredient, it is formed on the piezoelectric material film 12. In the second electrode film 14, as illustrated in FIG. 3, the peripheral part is left and inside part is removed so as to expose the outer surface 12a of the piezoelectric material film 12. Further, the second electrode film 14 is divided into a plurality of areas, on each of the cantilevered beams 21, 22, 23, 24.

Then, as illustrated in FIG. 2, each of the cantilevered beams 21, 22, 23, 24 is formed in a triangular shape in a plan view. Further, each of the cantilevered beams 21, 22, 23, 24 respectively has base parts 21a, 22a, 23a, 24a, fixed on the element substrate 2, and free beam parts 21b, 22b, 23b, 24b, not fixed on the element substrate 2. The part, including the base of each of the cantilevered beams 21, 22, 23, 24, respectively corresponds to the base parts 21a, 22a, 23a, 24a, the other parts correspond to free beam parts 21b, 22b, 23b, 24b. Each of the cantilevered beams 21, 22, 23, 24 are arranged at interval of a minute gap 16.

Then, as illustrated in FIG. 4(a), the free beam parts 21b, 22b, 23b, 24b have respectively beam tips 21e, 22e, 23e, 24e. Further, the free beam parts 21b, 22b, 23b, 24b have respectively tapered shape which the widths gradually decrease from the base parts 21a, 22a, 23a, 24a to the beam tips 21e, 22e, 23e, 24e.

Further, the beam tips 21e, 22e, 23e, 24e of all the cantilevered beams 21, 22, 23, 24 are converged towards a one tip point 20p. The tip point 20p is arranged in the center in a plan view of the beam member 20. The weight 25 is adhered to the all the cantilevered beams 21, 22, 23, 24 in the tip point 20p.

The weight 25 is formed with stainless steel. The weight 25 is, as illustrated in FIG. 3, adhered to the outer surface (the outer surface 12a of the piezoelectric material film 12) of the respective cantilevered beams 21, 22, 23, 24.

Further, as illustrated in FIG. 4(a), the weight 25 is adhered to a convergent area 20e of the beam member 20. The convergent area 20e is an area including beam tips 21e, 22e, 23e, 24e of all the cantilevered beams 21, 22, 23, 24, and it is a rectangular area neighboring the tip point 20p of the free beam parts 21b, 22b, 23b, 24b. All the free beam parts 21b, 22b, 23b, 24b are connected by the weight 25 in the convergent area 20e though, all the free beam parts 21b, 22b, 23b, 24b are separated in the area other than the convergent area 20e.

The convergent area 20e is a rectangular area including all the beam tips 21e, 22e, 23e, 24e. The underside of the central mesh area corresponds to the convergent area 20e, in FIG. 2. The underside of the central rectangular area corresponds to the convergent area 20e, in FIG. 4(a).

Further, the convergent area 20e is formed in an almost similar figure, which is smaller than the beam member 20, namely it is formed in a rectangular shape in a plan view (almost square), which is smaller than the beam member 20. The weight 25 is formed in an almost similar figure, which is smaller than the beam member 20, namely it is formed in a rectangular shape in a plan view (almost square), similar with the convergent area 20e.

Then, as illustrated in FIG. 4(a), the weight 25 is arranged in the position which the center part 25c is overlapped to the tip point 20p. The above-described arrangement of the weight 25 is also referred to as "central arrangement".

Further, in the MEMS transducer 10, arrangement direction, on the beam member 20, of the weight 25 is coincident with the beam member 20. Namely, as illustrated in FIG. 2, FIG. 4(a), the weight 25 is formed so that the four corner parts 20E, 20F, 20G, 20H of the beam member 20 are respectively coincident with the four corner parts 25E, 25F, 25G, 25H of the weight 25.

Different from the case illustrated in FIG. 4(a), as illustrated in FIG. 4(b), the weight 25 is able to be formed so that the center part 25c is arranged in a shifted position from the tip point 20p.

The ASIC 92, for example, is an integral circuit which amplifies an output signal of the MEMS transducer 10 (an integral circuit which outputs voltage in accordance with the motions of the cantilevered beams 21, 22, 23, 24 in the MEMS transducer 10).

The package substrate 30 is a board like member made of such as silicon, ceramic or the like (or PCB: Printed Circuit Board). The package substrate 30 has a flat package surface 30a. The MEMS transducer 10 is mounted on the package surface 30a, the ASIC 92 is mounted on the package surface 30a adjacent to the MEMS transducer 10.

The sealing cover 99 covers the MEMS transducer 10 and the ASIC 92. The sealing cover 99 is formed with a metal such as stainless steel or the like. The sealing cover 99 is adhered to the package surface 30a by forming of the weld 41.

The sealing cover 99 has a top surface 99E and a cover side-surface 99D. The top surface 99E is formed so as to oppose to the package substrate 30. The cover side-surface 99D is formed on the peripheral part of the top surface 99E. The cover side-surface 99D surrounds the top surface 99E, and it is adhered to the package surface 30a of the package substrate 30 by forming of the weld 41. Namely the weld 41 is formed on the whole of the lower end part (end part of the package surface 30a side) of the cover side-surface 99D. Thereby the above-described airtight sealing structure 1Y is formed.

(Method of Manufacturing the MEMS Microphone)

Figure 6:
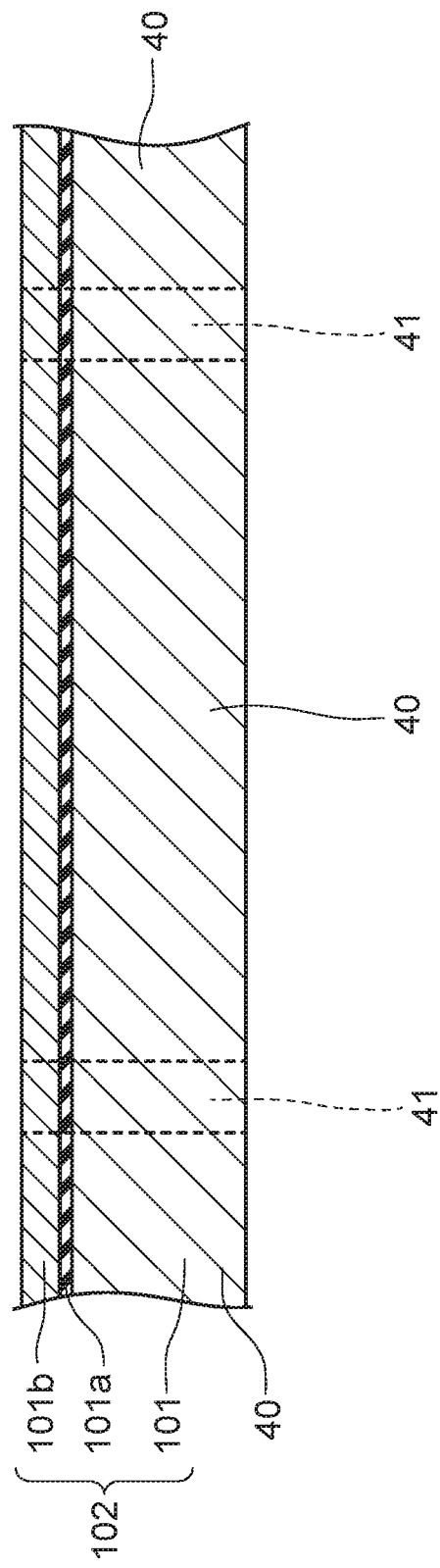
FIG. 6 is a sectional view, partially omitted, taken along the line 6-6 in FIG. 5 (b)

Subsequently, the method of manufacturing the MEMS microphone 100, having the above-described structures, will be explained with reference to FIG. 5 to FIG. 13. Here, FIG. 5 (a) is a perspective view showing a SOI (Silicon On Insulator) substrate 102 used for manufacturing the MEMS microphone 100 according to the embodiment of the present invention and the MEMS transducer 10, FIG. 5 (b) is a plan view, with enlargement, showing the front surface of the SOI substrate 102. FIG. 6 is a sectional view, partially omitted, taken along the line 6-6 in FIG. 5 (b). FIG. 7 to FIG. 13 are sectional views showing the manufacturing step of the MEMS transducer 10, corresponding to FIG. 6.

The method of manufacturing the MEMS microphone 100 has a MEMS transducer manufacturing step, a mounting step, and an airtight sealing step.

In the MEMS transducer manufacturing step, the MEMS transducer 10 is manufactured. In the mounting step, the MEMS transducer 10 and the ASIC 92 are mounted on the package substrate 30. In the airtight sealing step, the airtight sealing structure 1Y is formed. In this case, when a later-described decompression step is performed, the sealing cover 99 is adhered to the package substrate 30 by a weld.

(MEMS Transducer Manufacturing Step)

The MEMS transducer 10 is manufactured with the SOI substrate 102, as a MEMS substrate. The SOI substrate 102 is a substrate used for manufacturing the MEMS transducer 10, as illustrated in FIG. 6, it has a silicon substrate 101, an insulating layer 101a made of silicon dioxide and a silicon thin film layer 101b. Further, as illustrated in FIG. 5(b), the SOI substrate 102 has a plurality of element regions 40. Each of the element regions 40 is divided with scribe lines 41. The MEMS transducer 10 is manufactured from each of the element regions 40.

Then, the method of manufacturing the MEMS transducer 10 has a laminated film forming step, a laminated film pattering step, a metal film forming step, a weight forming step, a dividing step and a cantilevered beams forming step.

Figure 7:
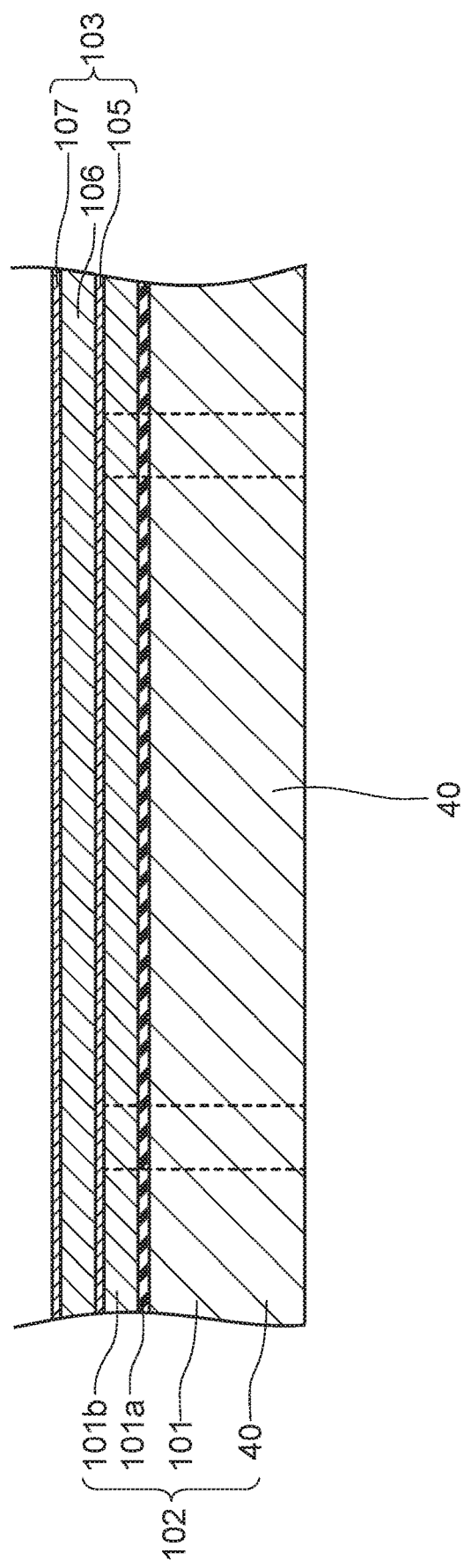
FIG. 7 is a sectional view showing the manufacturing step of the MEMS microphone according to the embodiment of the present invention, corresponding to FIG. 6.

At first, the laminated film forming step is formed. In the laminated film forming step, as illustrated in FIG. 7, a laminated film 103 is formed on the silicon thin-film layer 101b of the SOI substrate 102. The laminated film 103 is formed by laminating a first electrode film (lower electrode film) layer 105, a piezoelectric material film layer 106 and a second electrode film (upper electrode film) layer 107 sequentially.

In this case, at first, epitaxial growth of metal material, which has Pt as a main ingredient, is performed on the silicon thin-film layer 101b by sputtering. This epitaxial growth makes the first electrode film layer 105.

Subsequently, a piezoelectric material film layer forming step is performed. In this step, epitaxial growth of thin-film made of PZT is performed on the first electrode film layer 105 by sputtering to form the piezoelectric material film layer 106.

More subsequently, growth of metal material having Pt as main ingredient is performed on the piezoelectric material film layer 106 by sputtering to form the second electrode film layer 107. Note that the second electrode film layer 107 is able to be no-oriented polycrystal film or a preferentially oriented film with the (110) plane, or (111) plane, not epitaxial growth film.

Figure 8:
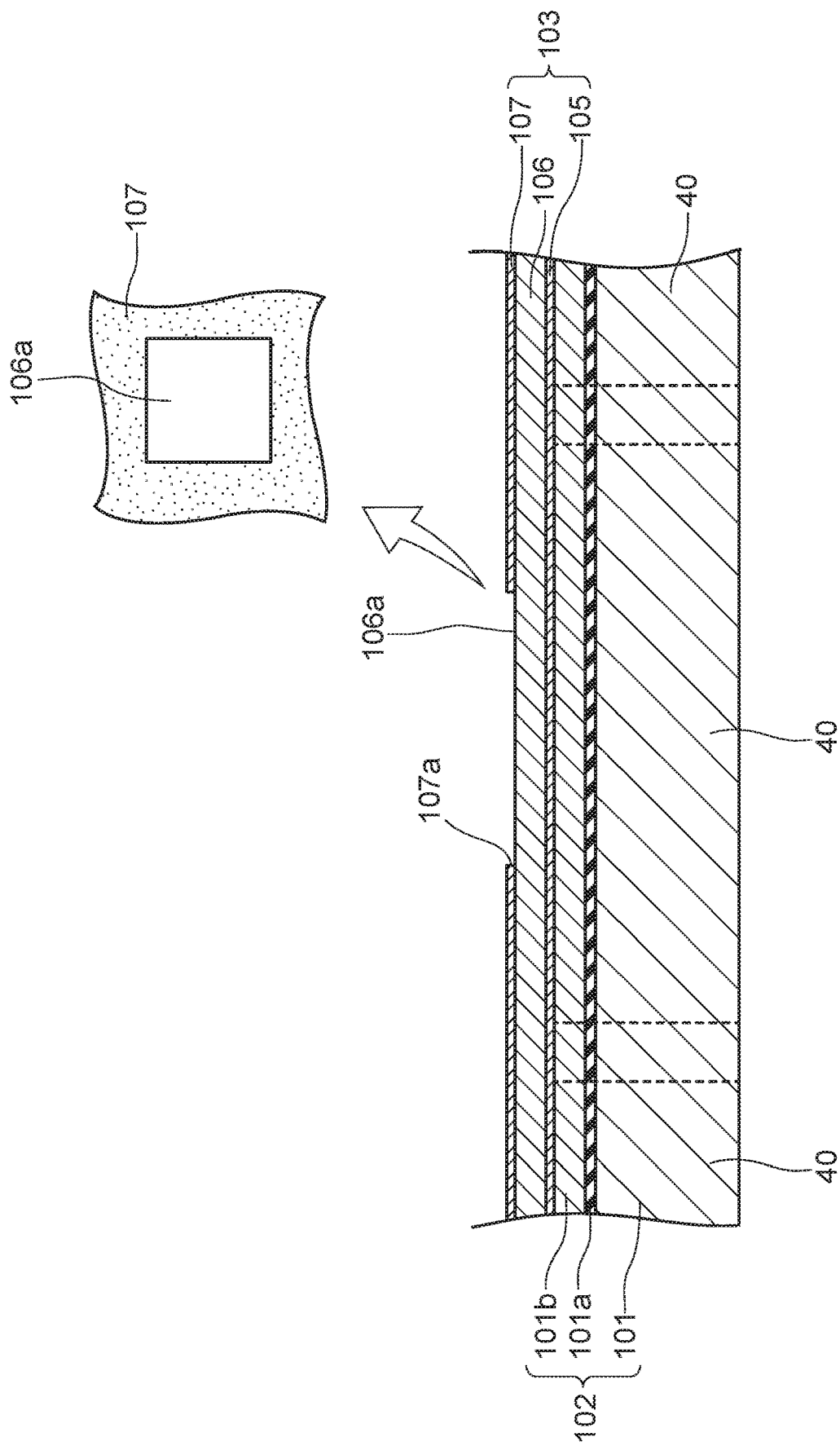
FIG. 8 is a sectional view showing the manufacturing step subsequent to that in FIG. 7.

Next, the laminated film pattering step is performed. In the laminated film pattering step, pattering of the laminated film 103 is performed. In the patterning, as illustrated in FIG. 8, unnecessary parts of the second electrode film layer 107 are removed by etching or the like, in each of the element regions 40, concave parts 107a are formed in the second electrode film layer 107. Thereby, surfaces 106a of the piezoelectric material film layer 106 are exposed. Each of the surface 106a will become the outer surface 12a of the piezoelectric material film 12 later.

Figure 9:
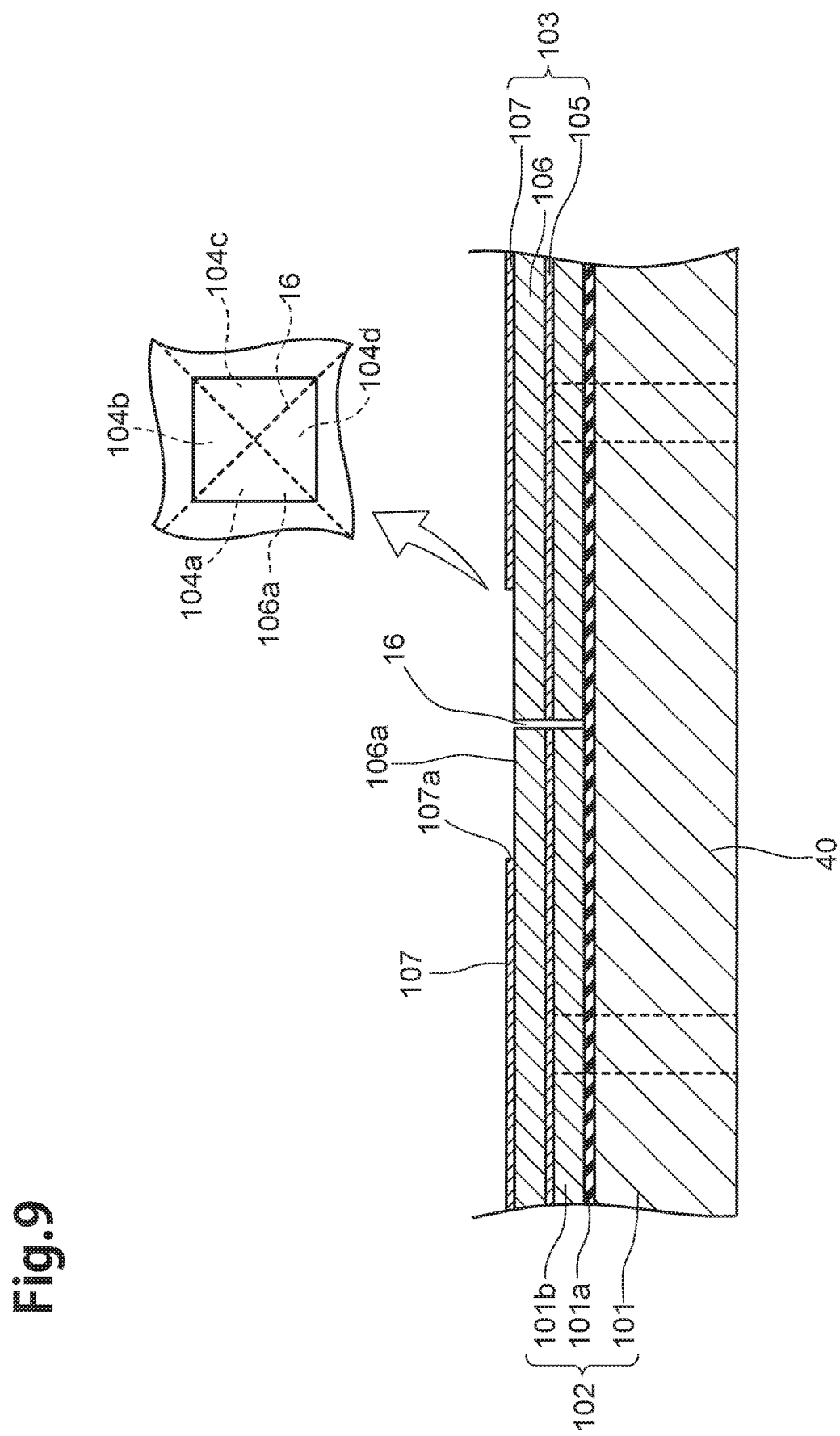
FIG. 9 is a sectional view showing the manufacturing step subsequent to that in FIG. 8.

Further, as illustrated in FIG. 9, the minute gaps 16 are formed in the laminated film 103 by the pattering of the laminated film 103. Thereby, in each of element regions 40, the laminated film 103 is divided into four beam regions 104a, 104b, 104c, 104d. The beam regions 104a, 104b, 104c, 104d are areas respectively corresponding to the cantilevered beams 21, 22, 23, 24, and they are formed respectively in tapered shape having beam tips common with the beam tips 21e, 22e, 23e, 24e. In this case, the beam tips of the beam regions 104a, 104b, 104c, 104d are converged in the one tip point, similar with the beam tips 21e, 22e, 23e, 24e.

The beam regions 104a, 104b, 104c, 104d have respectively the first electrode film layer 105, the piezoelectric material film layer 106 and the second electrode film layer 107. Further, the second electrode film layer 107 is divided into a plurality of regions corresponding to the second electrode films 14, in each of the beam regions 104a, 104b, 104c, 104d.

Figure 10:
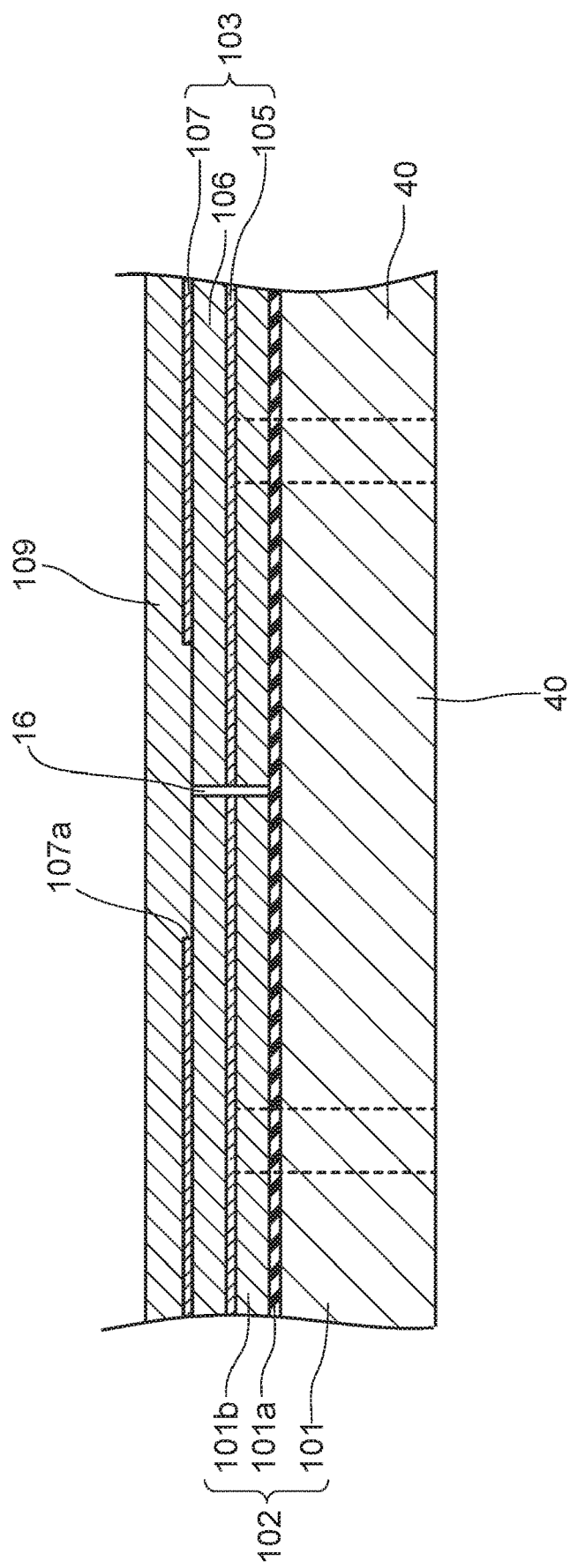
FIG. 10 is a sectional view showing the manufacturing step subsequent to that in FIG. 9.

Subsequently, the metal film forming step is performed. In the metal film forming step, as illustrated in FIG. 10, a metal film 109 is formed on the laminated film 103 of the SOI substrate 102. The metal film 109 is able to be formed with stainless steel.

Figure 11:
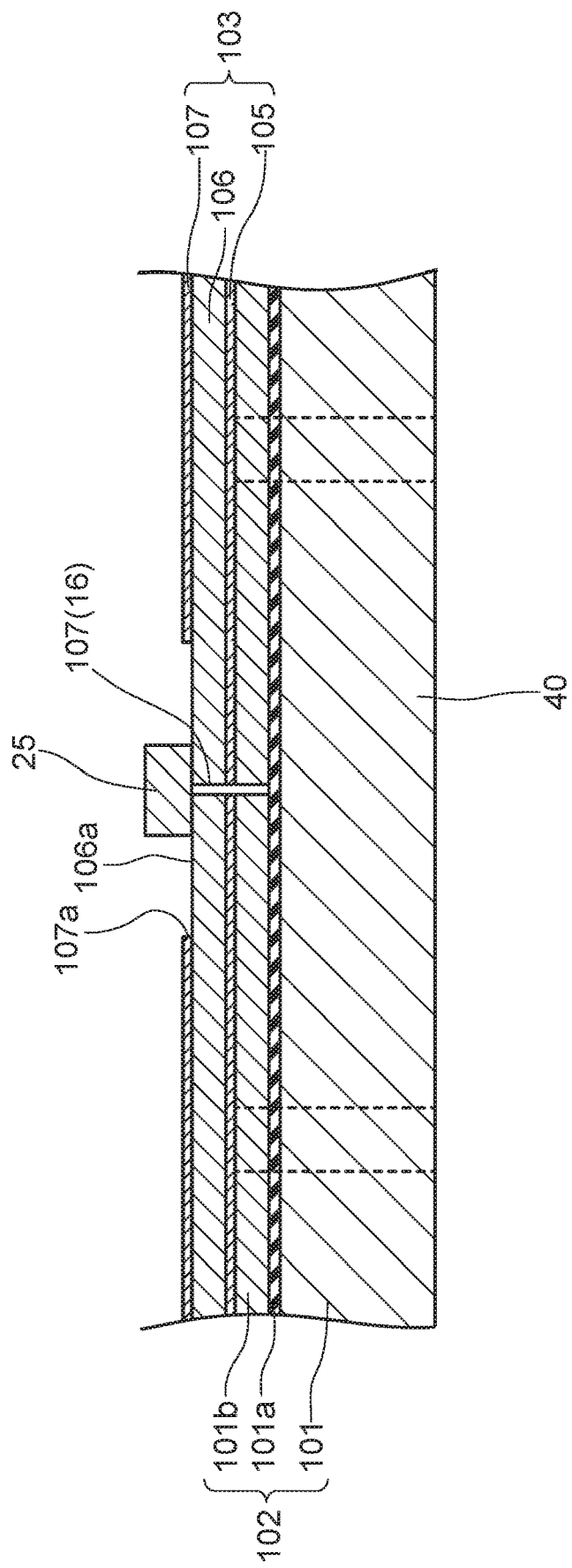
FIG. 11 is a sectional view showing the manufacturing step subsequent to that in FIG. 10.

Next, the weight forming step is performed. In the weight forming step, as illustrated in FIG. 11, the part of the metal film 109, which is formed on the convergent area 20e (not illustrated in FIG. 11), is left, the other parts are removed by etching or the like, in each of the element regions 40. Then, the weighs 25 are formed on the exposed surfaces 106a of the piezoelectric material film layer 106. The weights 25 are formed in the above-described convergent areas 20e so that all the beam regions 104a, 104b, 104c, 104d are connected, in each of the element regions 40. The weighs 25 are adhered to the convergent areas 20e respectively.

Figure 12:
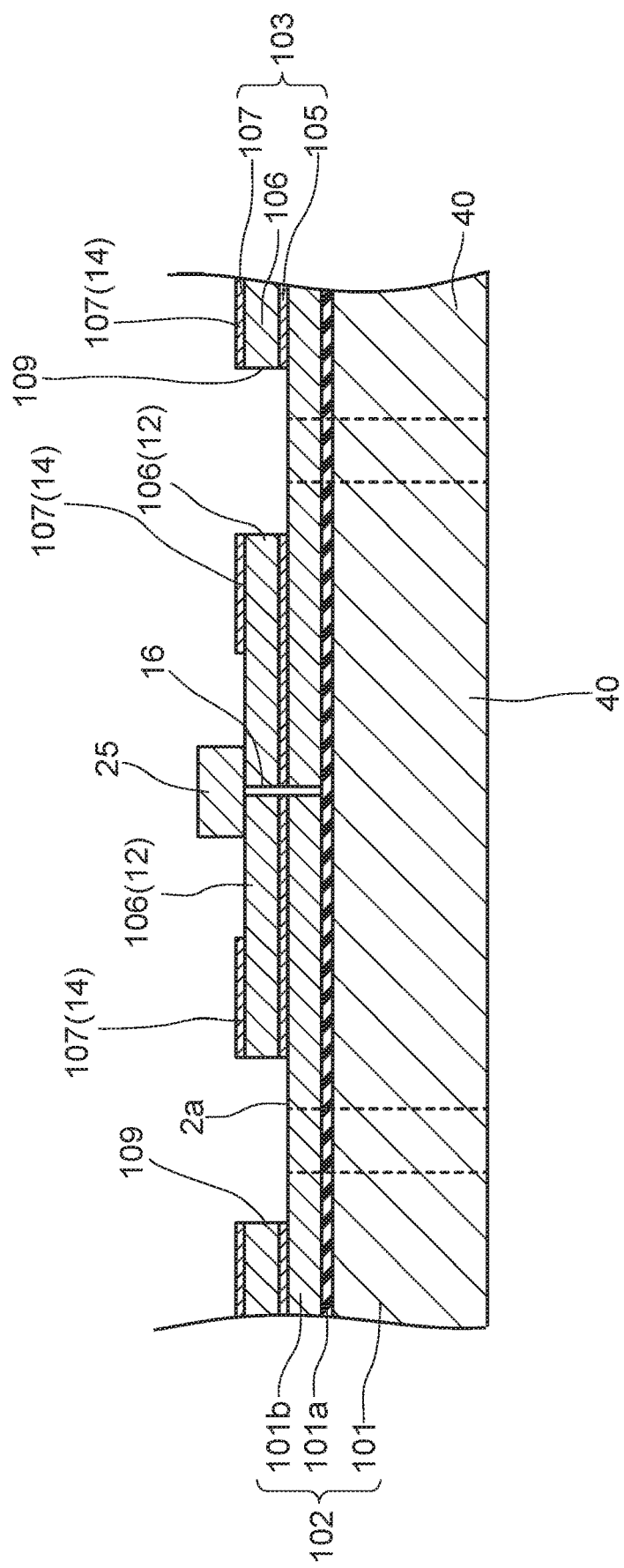
FIG. 12 is a sectional view showing the manufacturing step subsequent to that in FIG. 11.

More subsequently, the dividing step is performed. In the dividing step, unnecessary parts of the laminated film 103 are removed, and thereby the laminated film 103 is divided into the respective element regions 40, as illustrated in FIG. 12.

Figure 13:
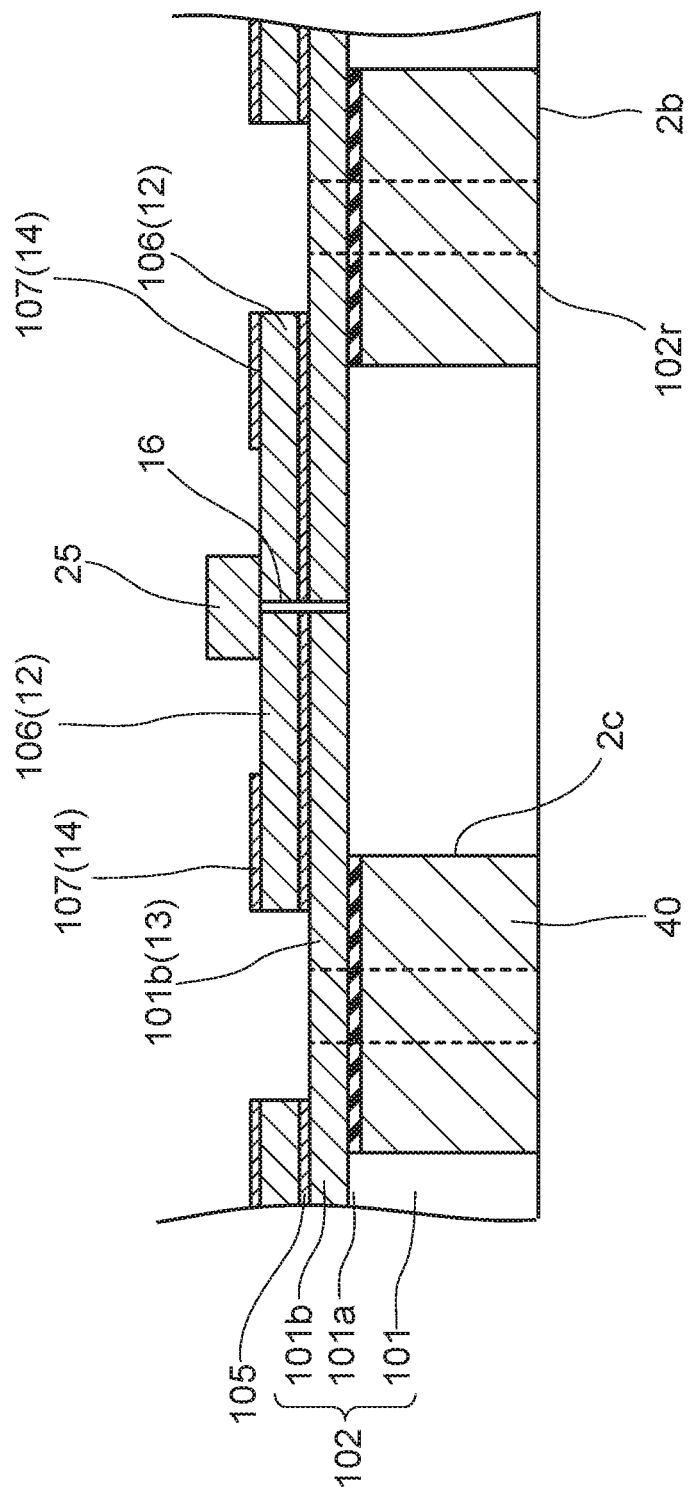
FIG. 13 is a sectional view showing the manufacturing step subsequent to that in FIG. 12.

After that, the cantilevered beams forming step is performed. In the cantilevered beams forming step, as illustrated in FIG. 13, unnecessary parts are removed by etching or the like, in the rear surface 102r, of the SOI substrate 102, which the laminated film 103 is not formed. Then, the element hole parts 2c are formed in the respective element regions 40. Thereby, the remained parts of the laminated film 103 are supported in cantilevered shape. As a result, the cantilevered beams 21, 22, 23, 24 are formed in accordance with the respective beam regions 104a, 104b, 104c, 104d, in the respective element regions 40.

After that, when the SOI substrate 102 is cut along with the scribe lines 41, the MEMS transducers 10 are manufactured.

The MEMS package 1 is manufactured by using the MEMS transducer 10, manufactured by the above, the ASIC 92 and the package substrate 30. Further, the MEMS microphone 100 is manufactured by using the sealing cover 99, as described later.

(Mounting Step and Airtight Sealing Step)

The mounting step is performed after the MEMS transducer 10 is manufactured. In the mounting step, the MEMS transducer 10 and the ASIC 92 are mounted on the package substrate 30. In this case, the MEMS transducer 10 and the ASIC 92 are put on the package substrate 30, further connecting process with the wires 76,77 is performed, thereby, MEMS transducer 10 and the ASIC 92 are mounted on the package substrate 30.

Figure 19:
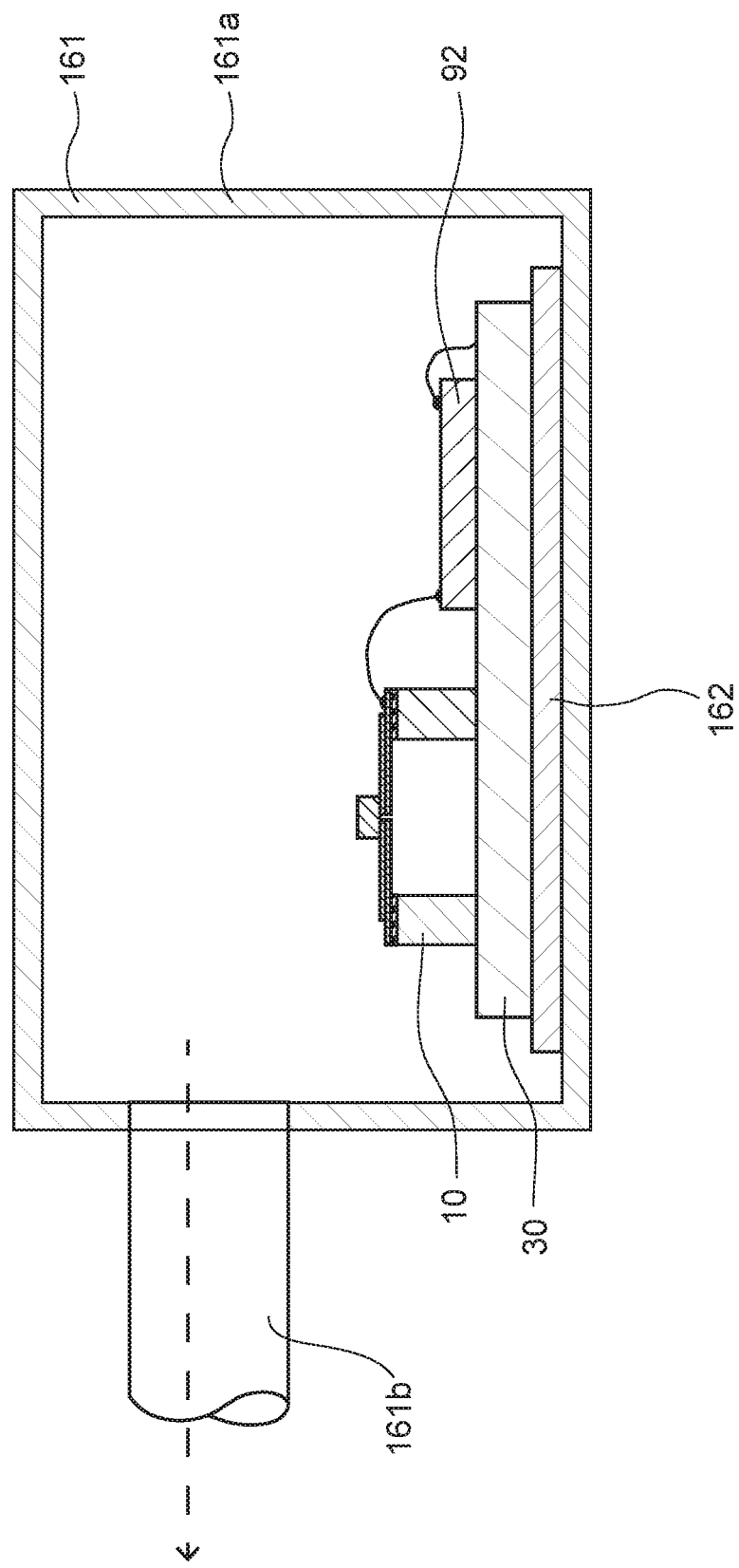
FIG. 19 is a sectional view showing a vacuum chamber, which is used for an airtight sealing step, the MEMS transducer, an ASIC, a package substrate and a heater.

The airtight sealing step is performed subsequently to the mounting step. In the airtight sealing step, the airtight sealing structure 1Y is formed. In this case, for example, as illustrated in FIG. 19, the package substrate 30, which the MEMS transducer 10 and the ASIC 92 are mounted, is accommodated in a vacuum chamber 161. The vacuum chamber 161 has a sealing accommodating part 161a and an exhaust pipe 161b, a heater 162 is accommodated in a vacuum chamber 161. The package substrate 30 is put on the heater 162.

In the airtight sealing step, a heating process is performed in the sealing accommodating part 161a, the package substrate 30 is heated with heater 162. Then, moisture and unnecessary things are removed by heating. Further, the airtight sealing step has a decompression step. Namely, air is exhausted through the exhaust pipe 161b in addition to the heating process, thereby inside of the vacuum chamber 161 is decompressed. When the decompression step is performed, air pressure, inside of the sealing accommodating part 161a, becomes lower than the atmospheric pressure Then, when the decompression step is performed, the package substrate 30 is covered with the sealing cover 99, further, the weld 41 is formed on the junction part of the sealing cover 99 and the package substrate 30 with not-illustrated welding apparatus. Thereby the MEMS microphone 100 is manufactured. Because air pressure, inside of the sealing accommodating part 161a, is lower than the atmospheric pressure, the sealed-up space 1X is formed when the weld 41 is formed.

The MEMS microphone 100 is manufactured by performing the airtight sealing step, as described above.

(Operation and Effect of the MEMS Microphone)

Figure 20:
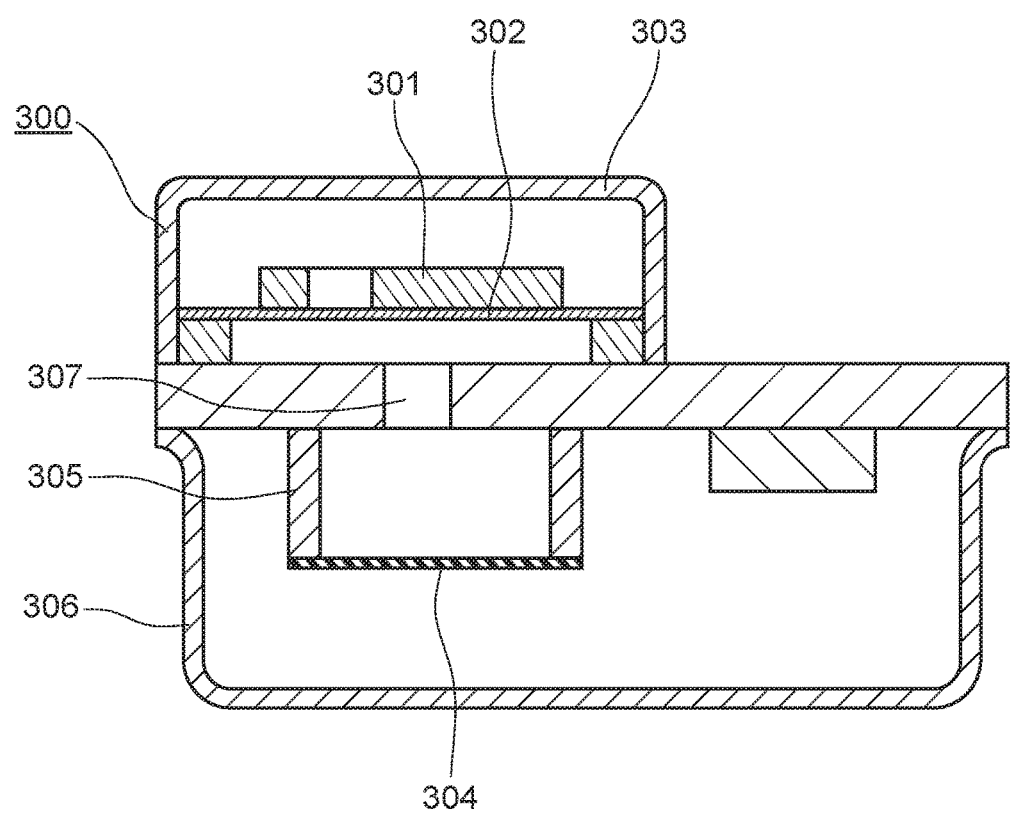
FIG. 20 is a sectional view showing the conventional MEMS transducer.
Figure 21:
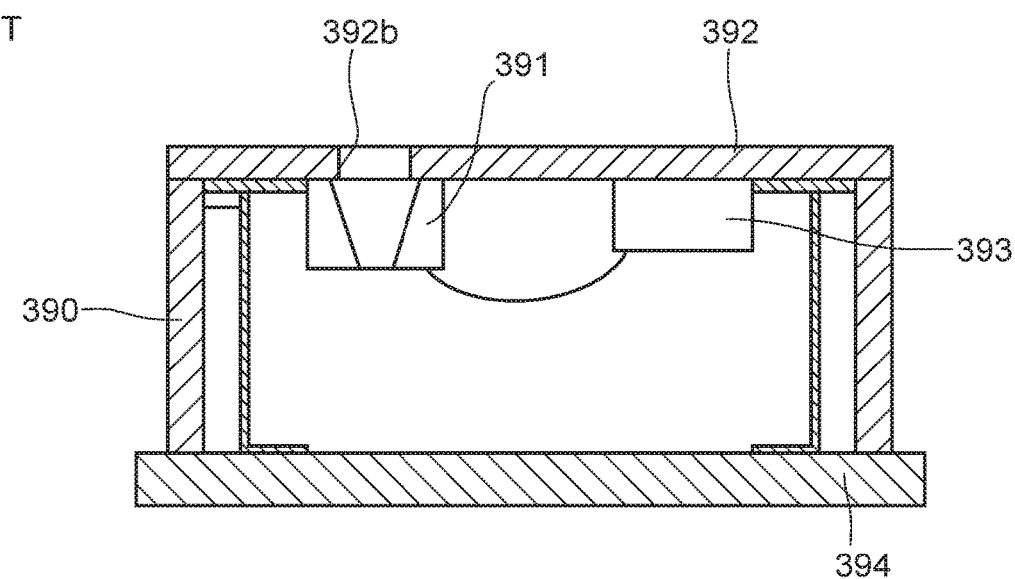
FIG. 21 is a sectional view showing another conventional MEMS transducer.

The conventional MEMS transducer 300, illustrated in FIG. 20, has the two-room structure. In the MEMS transducer 300, the vibration of the weight 301 is transmitted to the air, the vibration of the air is transmitted to membrane 304, so the vibration of the weight 301 is likely to be attenuated before detection, therefore, it is difficult to enhance the sensitivity.

On the other hand, in the MEMS microphone 100, the weight 25 vibrates by the vibration, being applied to the MEMS microphone 100. In this case, the weight 25 moves toward three-dimensional direction with being supported by the silicon thin-film 13. Then, because the weight 25 is adhered to the piezoelectric material film 12 of the beam member 20, the vibration of the weight 25 is transmitted directly to the piezoelectric material film 12. Therefore, the vibration of the weight 25 is transmitted directly to the piezoelectric material film 12 without waste.

Then, in accordance with the motion of the weight 25, the piezoelectric material films 12 of the respective cantilevered beams 21, 22, 23, 24 are transformed. The piezoelectric material films 12 and the first, second electrodes film 15, 14 are included in the beam member 20. Therefore, the voltages, in accordance with the motion of the piezoelectric material films 12, are detected via the first, second electrode films 15, 14.

As described-above, in the MEMS microphone 100, because the vibration of the weight 25 is detected, not intervening the vibration of the air, by the piezoelectric material films 12 without waste, the detecting of the vibration is very accurate, therefore it can enhance the sensitivity, in the MEMS microphone 100.

Further, the MEMS microphone 100 has the airtight sealing structure 1Y concerning the MEMS transducer 10 and the ASIC 92. The MEMS microphone 100 does not have a sound hole. Therefore, the influence of outer noise is attenuated, and particles never enter. Further, delicate vibration is detected accurately without influence of the outside air. Therefore, the sensitivity of the MEMS microphone 100 is able to be further enhanced.

Because the MEMS microphone 100 does not have a sound hole, the MEMS microphone 100 is able to be used as a bone conduction microphone. The bone conduction microphone is a microphone which detects the voice, of human being, conveyed to the head bone. The bone conduction microphone is different from the microphone which detects the vibration of the air.

Furthermore, because the sealed-up space 1X, caused by the airtight sealing structure 1Y, is decompressed than the atmospheric pressure, the delicate motions of the weight 25 and the piezoelectric material films 12 are not likely to be influenced by the air. Therefore, the sensitivity of the MEMS microphone 100 is able to be furthermore enhanced.

Then, the MEMS transducer 10 has the element substrate 2, the beam member 20 and the weight 25. The beam member 20 has the four cantilevered beams 21, 22, 23, 24. The four cantilevered beams 21, 22, 23, 24 have respectively the free beam parts 21b, 22b, 23b, 24b, and the beam tips 21e, 22e, 23e, 24e of the free beam parts 21b, 22b, 23b, 24b are converged toward the tip point 20p. All the four beam tips 21e, 22e, 23e, 24e are connected by the weight 25.

Further, the weight 25 is formed in an almost similar figure of the beam member 20, and it is arranged in the central arrangement, as illustrated in FIG. 4(a). Therefore, the vibration of the weight 25 is transmitted to the respective free beam parts 21b, 22b, 23b, 24b equivalently (this is also called "equivalent transmission"). Then, the vibration of the weight 25 is detected in balance by the respective free beam parts 21b, 22b, 23b, 24b.

Further, when the weight 25 is formed in an almost similar figure of the beam member 20, alignment of the weight 25, for realizing the equivalent transmission, is completed with just arrangement of the weight 25 with the central arrangement. Therefore, in the MEMS transducer 10, arrangement of the weight 25 is easy to be performed, and the MEMS transducer 10 is manufactured easily.

Modified Example 1

Figure 14:
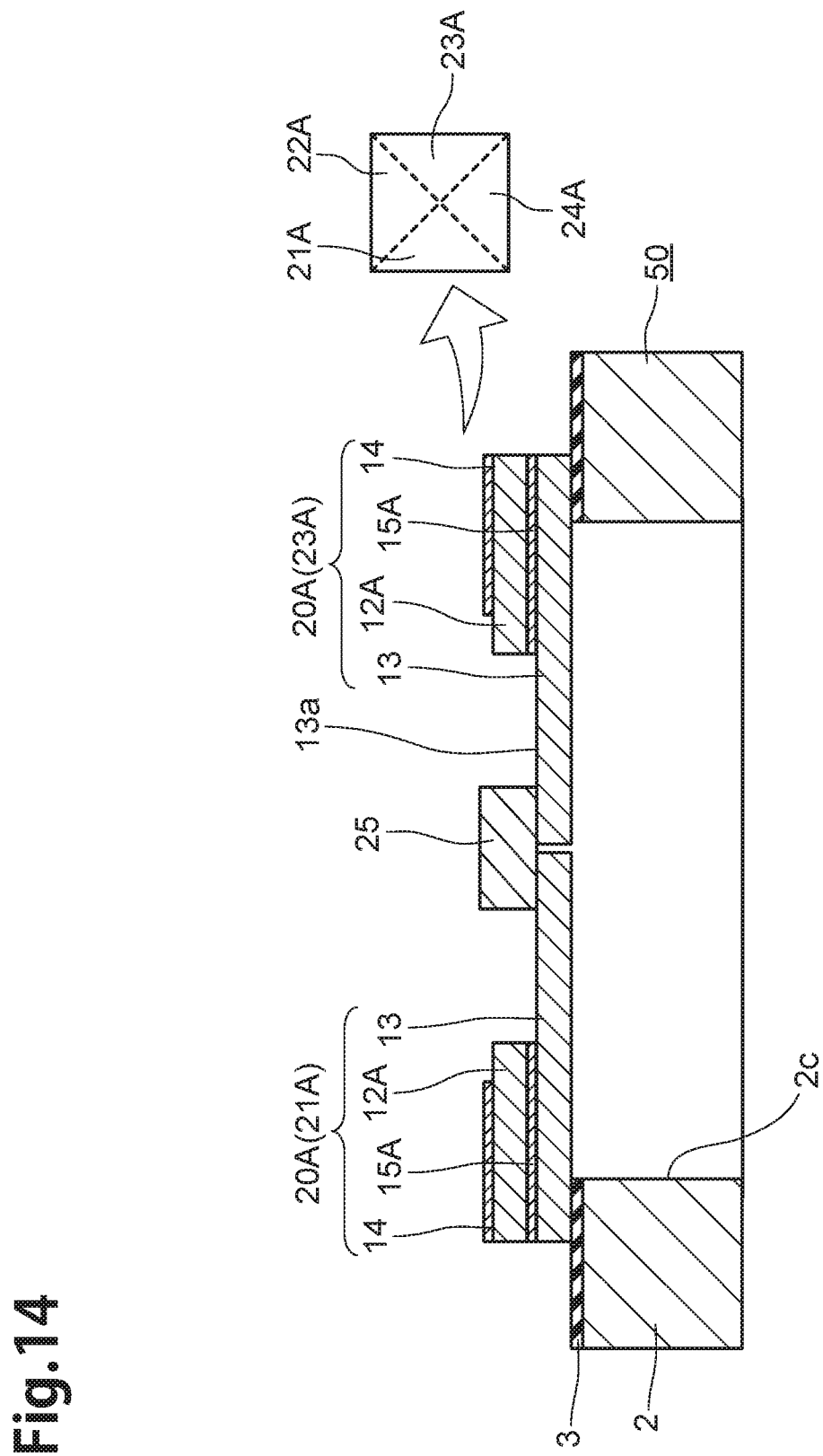
FIG. 14 is a sectional view, corresponding to FIG. 3, showing the MEMS transducer according to the modified example 1.

Next, a MEMS transducer 50 according to the modified example 1, is explained with reference to FIG. 14. Here, FIG. 14 is a sectional view, corresponding to FIG. 3, showing the MEMS transducer 50 according to the modified example 1.

The MEMS transducer 50 is different in that it has a beam member 20A, in place of the beam member 20, as compared with the above-described MEMS transducer 10.

The beam member 20A is different in that it has four cantilevered beams 21A, 22A, 23A, 24A, in place of the cantilevered beams 21, 22, 23, 24, as compared with the above-described beam member 20. The cantilevered beams 21A, 22A, 23A, 24A are different in that it has a piezoelectric material film 12A, first electrode film 15A in place of the piezoelectric material film 12, the first electrode film 15, as respectively compared with the cantilevered beams 21, 22, 23, 24.

In the above-described cantilevered beams 21, 22, 23, 24, the piezoelectric material film 12, the first electrode film 15 are formed in the shapes common with the silicon thin-film 13.

However, in the above-described cantilevered beams 21A, 22A, 23A, 24A, the piezoelectric material film 12A, the first electrode film 15A are formed in the shape being different from the silicon thin-film 13. Thereby, an outer surface 13a of the silicon thin-film 13 is exposed. The silicon thin-film 13 is arranged in the convergent area (not illustrated in FIG. 14), the weight 25 is adhered to the outer surface 13a, arranged in the convergent area.

In case of the MEMS transducer 50, the weight 25 vibrates with being supported by the silicon thin-film 13. The vibration of the weight 25 is transmitted to piezoelectric material film 12A of the cantilevered beams 21A, 22A, 23A, 24A without intervening of the air vibration. Therefore, the MEMS transducer 50 also exhibits the same operation and effect with the MEMS transducer 10.

Modified Example 2

Figure 15:
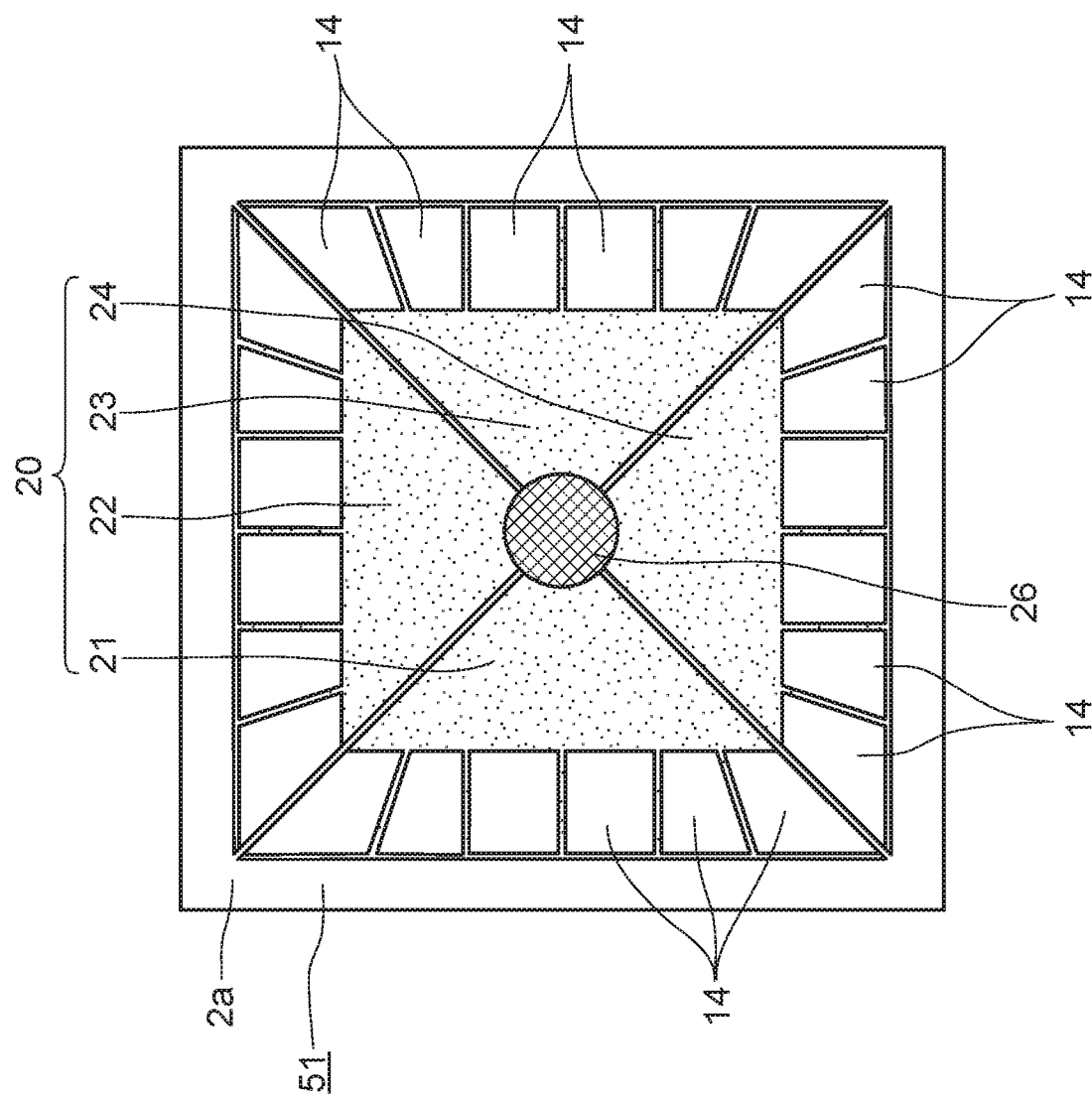
FIG. 15 is a plan view, corresponding to FIG. 2, showing the MEMS transducer according to the modified example 2.

Next, a MEMS transducer 51 according to the modified example 2, is explained with reference to FIG. 15. Here, FIG. 15 is a plan view, corresponding to FIG. 2, showing the MEMS transducer 51 according to the modified example 2.

The MEMS transducer 51 is different in that a weight 26, in place of the weight 25, is formed, as compared with the above-described MEMS transducer 10.

The weight 26 is different in that it is formed in a circular shape, as compared with the above-described weight 25 though, the weight 26 is the same with the weight 25, on the other points. Therefore, the MEMS transducer 51, which the weight 26 is formed, also exhibits the same operation and effect with the MEMS transducer 10.

Modified Example 3

Figure 16:
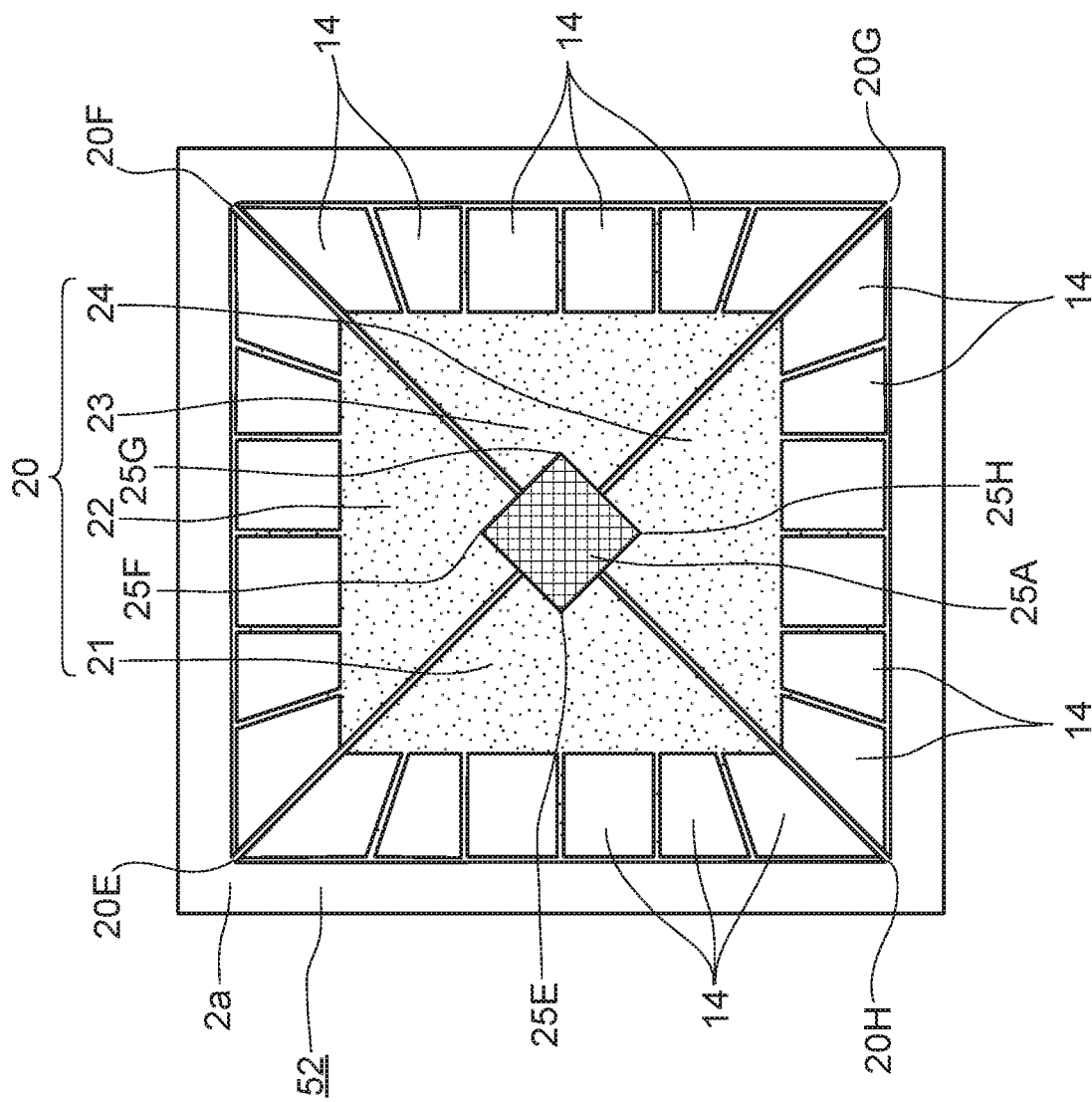
FIG. 16 is a plan view, corresponding to FIG. 2, showing the MEMS transducer according to the modified example 3.

Next, a MEMS transducer 52 according to the modified example 3, is explained with reference to FIG. 16. Here, FIG. 16 is a plan view, corresponding to FIG. 2, showing the MEMS transducer 52 according to the modified example 3.

The MEMS transducer 52 is different in that a weight 25A, in place of the weight 25, is formed, as compared with the above-described MEMS transducer 10.

The weight 25A is different in that it is arranged in a different direction on the beam member 20 from the weight 25, as compared with the above-described weight 25. In case of the above-described weight 25, the arrangement direction on the beam member 20 coincides with the beam member 20.

However, in case of the weight 25A, the four corner parts 25E, 25F, 25G, 25H are arranged with directions different from the four corner parts 20E, 20F, 20G, 20H of the beam member 20. At this point, the weight 25A is different from the weight 25, but they coincide each other on the other points. Therefore, the MEMS transducer 52, which the weight 25A is formed, also exhibits the same operation and effect with the MEMS transducer 10.

Modified Example 4

Figure 17:
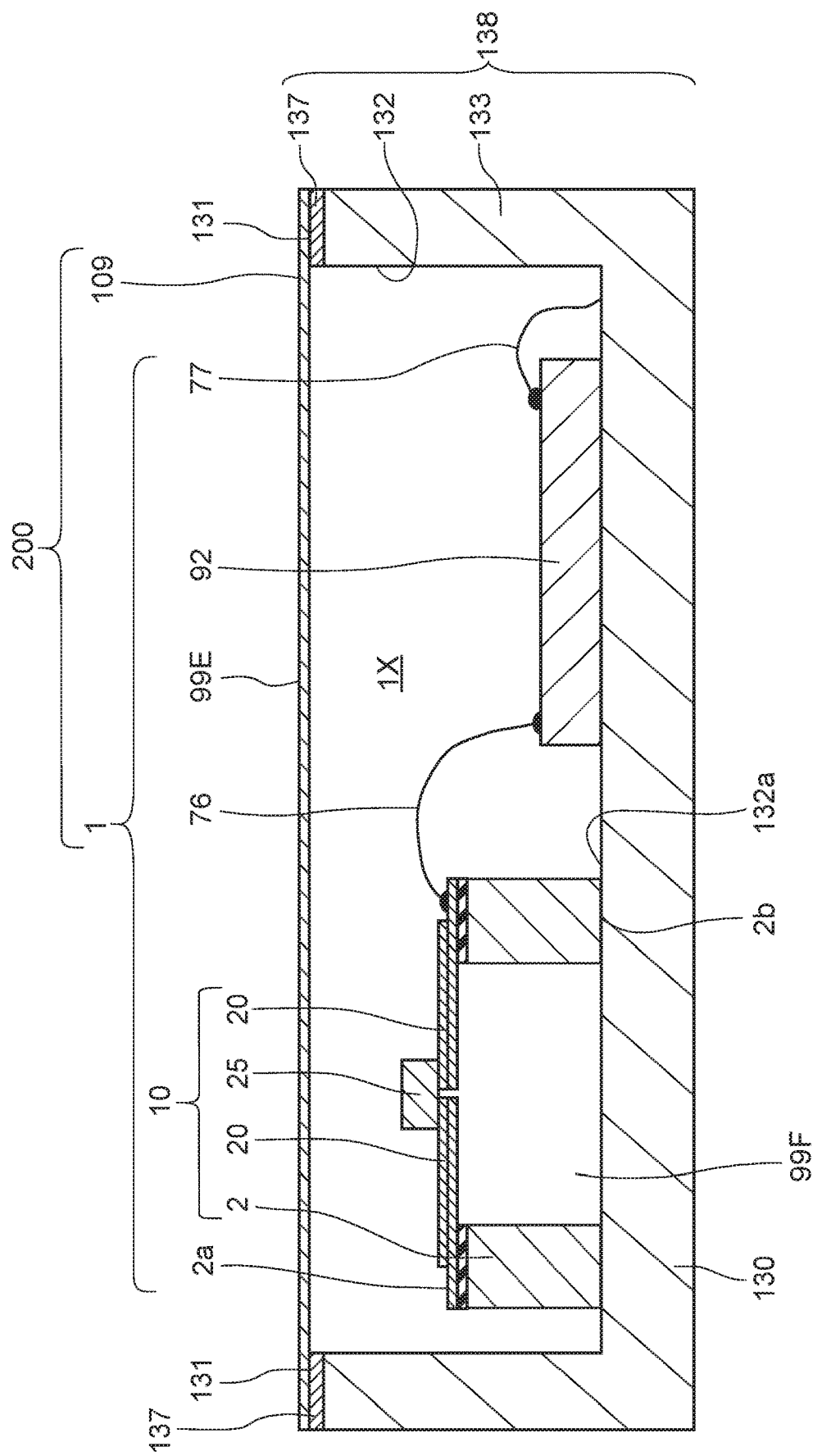
FIG. 17 is a sectional view, corresponding to FIG. 3, showing the MEMS microphone according to the modified example 4.

Next, a MEMS microphone 200 according to the modified example 4, is explained with reference to FIG. 17. Here, FIG. 17 is a sectional view, corresponding to FIG. 1, showing the MEMS microphone 200 according to the modified example 4.

The MEMS microphone 200 is different in that it has a cavity substrate 130 and a lid plate 109, in place of the package substrate 30 and the sealing cover 99, as compared with the MEMS microphone 100.

The cavity substrate 130 is formed with ceramic or metal. A concave part 132 is formed on the surface 131 of the cavity substrate 130. Further, an annular convex part 133, which surrounds entirely the concave part 132, and is formed flat entirely in the surface, is formed.

The lid plate 109 is a member formed in flat. The lid plate 109 has a form and size, which is adhered to the annular convex part 133 to close the concave part 132.

Then, in the MEMS microphone 200, the MEMS transducer 10, together with the ASIC 92, is mounted on the bottom part 132a of the concave part 132 of the cavity substrate 130, and the lid plate 109 is adhered by forming of the weld 137, thereby the airtight sealing structure 138, similar with the MEMS microphone 100, is formed.

Because the MEMS microphone 200 has the MEMS transducer 10, similar with the MEMS microphone 100, and further has the airtight sealing structure 138, it exhibits the same operation and effect with the MEMS microphone 100.

Modified Example 5

Figure 18:
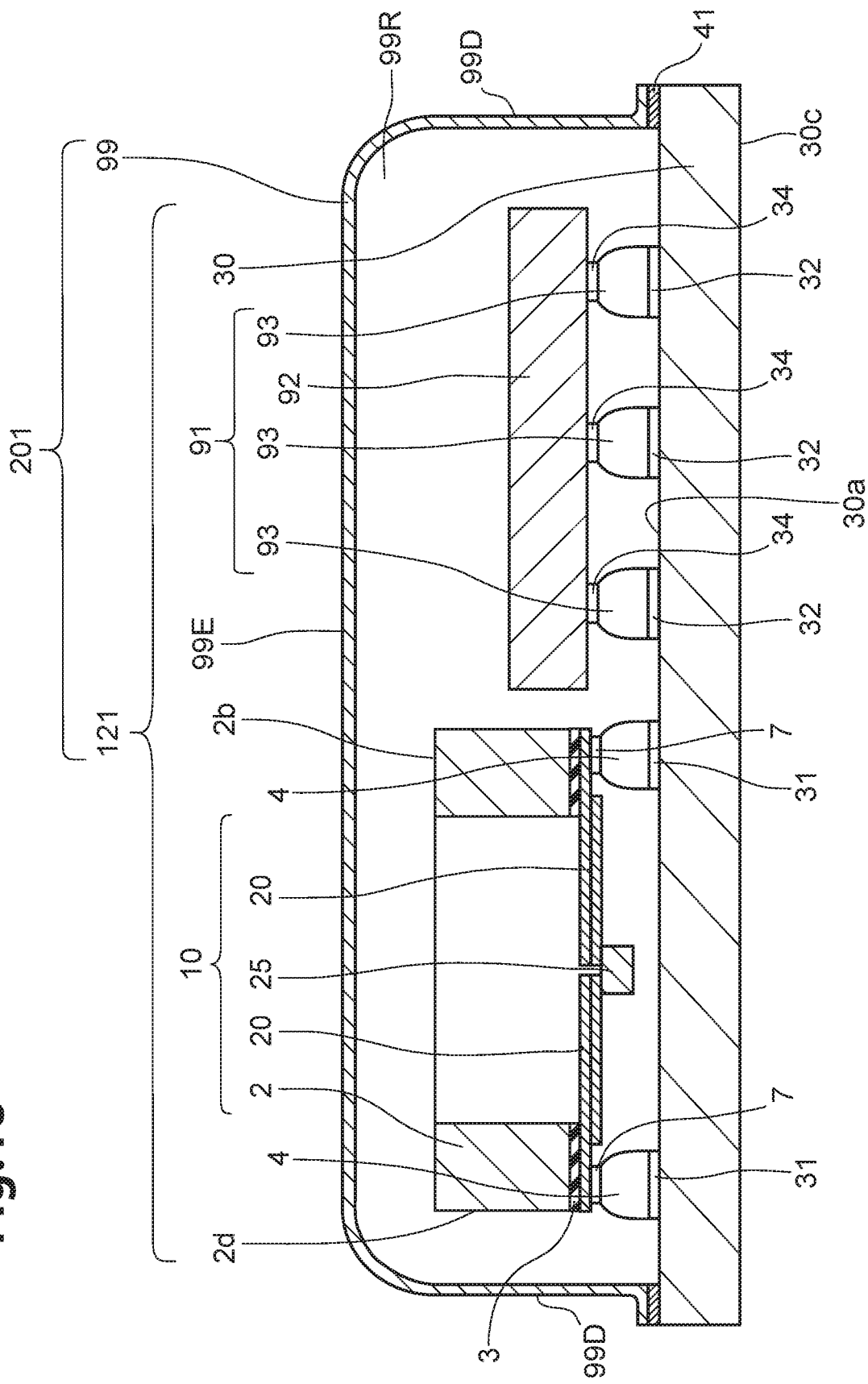
FIG. 18 is a sectional view, corresponding to FIG. 3, showing the MEMS microphone according to the modified example 5.

Next, a MEMS microphone 201 according to the modified example 5, is explained with reference to FIG. 18. Here, FIG. 18 is a sectional view, corresponding to FIG. 1, showing the MEMS microphone 201 according to the modified example 5.

The MEMS microphone 201 is different in that it has a MEMS package 121, in place of the MEMS package 1, as compared with the above-described MEMS microphone 100.

The MEMS package 121 is different in that the MEMS transducer 10 is mounted on the package substrate 30 by the FCB (Flip Chip Bonding), and it has an ASIC package 91 in place of the ASIC 92.

In the MEMS package 121, the MEMS transducer 10 is mounted on the package substrate 30 so that the front surface 2a and the weight 25 oppose to the package substrate 30.

The MEMS transducer 10 is mounted on the package surface 30a of the package substrate 30 with bonding bumps 4. The bonding bumps 4 are adhered respectively to both the electrode pads 7, formed in the front surface 2a, and the electrode pads 31 formed in the package surface 30a of the package substrate 30. The bonding bumps 4 connect the MEMS transducer 10 electrically and fixedly to the package substrate 30.

The ASIC package 91 has the ASIC 92, the package substrate 30, which the ASIC 92 is adhered, and bonding bumps 93. Electrode pads 34 are formed lower side of the ASIC 92. The electrode pads 34 are connected to the electrode pads 32 of the package surface 30a by the bonding bumps 93.

Because the MEMS microphone 201 has also the MEMS transducer 10, similar with the MEMS microphone 100, it exhibits the same operation and effect with the MEMS microphone 100.

In the above-described embodiments, the insulating film 3, made of silicon dioxide ($SiO_2$), is formed on the front surface 2a side of the element substrate 2. The insulating film 3, made of the other oxide films, are able to be formed, in place of the insulating film 3 made of silicon dioxide ($SiO_2$).

This invention is not limited to the foregoing embodiments but various changes and modifications of its components may be made without departing from the scope of the present invention. Besides, it is clear that various embodiments and modified examples of the present invention can be carried out on the basis of the foregoing explanation. Therefore, the present invention can be carried out in modes other than the above-mentioned best modes within the scope equivalent to the following claims.

What is claimed is:

1. A MEMS microphone comprising:
    a MEMS transducer;
    a sealing cover; and
    a package substrate;
    wherein the MEMS transducer comprises an element substrate, a plurality of cantilevered beams, and a weight,
    wherein the cantilevered beam respectively has a base part, fixed on the element substrate, and a free beam part, not fixed on the element substrate, and the cantilevered beams are formed by laminating a piezoelectric material film and a first, second electrode films being formed to sandwich the piezoelectric material film,
    wherein the free beam part has a beam tip, and the free beam part is formed in a tapered shape which the width gradually decreases from the base part to the beam tip,
    wherein the beam tips of all the plurality of cantilevered beams are converged toward a tip point, wherein the weight is adhered to a convergent area including the beam tips of the cantilevered beams, wherein the MEMS microphone further comprises an airtight sealing structure, formed with the sealing cover and the package substrate, which is formed by mounting the MEMS transducer on the package substrate, and adhering the sealing cover to the package substrate so as to surround the MEMS transducer.

2. The MEMS microphone according to claim 1,
wherein the sealing cover and the package substrate form a sealed-up space, which is decompressed than the atmospheric pressure.

3. The MEMS microphone according to claim 1,
wherein the package substrate has a package surface, formed flat, an ASIC is mounted on the package surface together with the MEMS transducer,
wherein the sealing cover and the package substrate form a sealed-up space, and the ASIC is accommodated in the sealed-up space together with the MEMS transducer.

4. The MEMS microphone according to claim 1,
wherein the package substrate is formed with a cavity substrate, which has a concave part formed on the surface, and has an annular convex part having a flat surface,
wherein the sealing cover is formed with a lid plate, which is adhered to the annular convex part,
wherein the airtight sealing structure is a structure which an ASIC is mounted on a bottom part of the concave part of the cavity substrate together with the MEMS transducer, and the lid plate is adhered to the annular convex part.

5. The MEMS microphone according to claim 1,
wherein the weight is formed in an almost similar figure, which is smaller than a beam member including all the plurality of cantilevered beams.

6. The MEMS microphone according to claim 1,
wherein the weight is arranged in the position which a center part of the weight is overlapped to the tip point.

7. The MEMS microphone according to claim 1,
wherein the weight is adhered to an outer surface of the cantilevered beams.

8. The MEMS microphone according to claim 1,
wherein the weight is adhered to all the beam tips, which are converged toward the tip point.

9. The MEMS microphone according to claim 1,
wherein the weight is formed with stainless steel.

10. The MEMS microphone according to claim 1,
wherein the sealing cover is adhered to the package substrate with forming a weld to form the airtight sealing structure.

11. A method of manufacturing a MEMS microphone having a MEMS transducer, a sealing cover and a package substrate, comprising:
a MEMS transducer manufacturing step for manufacturing the MEMS transducer;
a mounting step for mounting the MEMS transducer on the package substrate; and
an airtight sealing step for forming an airtight sealing structure, which is surrounded by the sealing cover and the package substrate, by adhering the sealing cover to the package substrate so as to surround the MEMS transducer,
wherein the MEMS transducer manufacturing step comprises a laminated film forming step for forming a laminated film, which a first electrode film, a piezoelectric material film and a second electrode film are laminated sequentially, on a surface of a MEMS substrate, used for manufacturing the MEMS transducer,
a laminated film pattering step for patterning the laminated film, so that a surface of the piezoelectric material film is exposed and the first electrode film, the piezoelectric material film and the second electrode film are divided into a plurality of beam regions, in an respective element region, of the MEMS substrate, which the MEMS transducer is formed,
a metal film forming step for forming a metal film on the surface of the MEMS substrate,
a weight forming step for forming a weight on the exposed surface of the piezoelectric material film so that an unnecessary part of the metal film is removed to connect the beam regions are connected, in the respective element region,
a dividing step for dividing the laminated film by removing the unnecessary part of the laminated film, into the respective element regions, and
a cantilevered beams forming step for forming cantilevered beams, made of the remained parts of the first electrode film, the piezoelectric material film and the second electrode film, by removing an unnecessary part of a rear surface, of the MEMS substrate, which the laminated film is not formed.

12. The method of manufacturing a MEMS microphone according to claim 11,
wherein the airtight sealing step has a decompression step which the sealing cover and the package substrate are arranged inside a vacuum chamber, and the inside of the vacuum chamber is decompressed.

13. The method of manufacturing a MEMS microphone according to claim 11,
wherein the laminated film forming step is performed so that a SOI substrate is used as the MEMS substrate, the laminated film is formed on a silicon thin-film layer of the SOI substrate.

14. The method of manufacturing a MEMS microphone according to claim 11,
wherein the metal film forming step is performed so that the metal film is formed with stainless steel.

15. The method of manufacturing a MEMS microphone according to claim 11,
wherein the laminated film pattering step is performed so that the beam regions are respectively formed in a tapered shape having a beam tip, and the beam tips are converged entirely toward a tip point,
wherein the weight forming step is performed so that a part, of the metal film, which is formed in a convergent area, including the beam tips of the beam regions, is left.

* * * * *